United States Patent
Suenaga et al.

(10) Patent No.: US 8,310,136 B2
(45) Date of Patent: Nov. 13, 2012

(54) PIEZOELECTRIC THIN FILM ELEMENT, AND PIEZOELECTRIC THIN FILM DEVICE

(75) Inventors: Kazufumi Suenaga, Tsuchiura (JP); Kenji Shibata, Tsukuba (JP); Hideki Sato, Hamamatsu (JP); Akira Nomoto, Kasumigaura (JP)

(73) Assignee: Hitachi Cable, Ltd., Tokyo (JP)

(*) Notice: Subject to any disclaimer, the term of this patent is extended or adjusted under 35 U.S.C. 154(b) by 306 days.

(21) Appl. No.: 12/814,544

(22) Filed: Jun. 14, 2010

(65) Prior Publication Data

US 2010/0320874 A1    Dec. 23, 2010

(30) Foreign Application Priority Data

Jun. 22, 2009    (JP) ................................. 2009-147994

(51) Int. Cl.
     *H01L 41/187*      (2006.01)
(52) U.S. Cl. .................. 310/358; 501/134; 252/62.9 PZ
(58) Field of Classification Search .................. 310/358; 501/134; 252/62.9 PZ; 257/347
See application file for complete search history.

(56) References Cited

U.S. PATENT DOCUMENTS

| | | | |
|---|---|---|---|
| 6,347,862 B1 | 2/2002 | Kanno et al. | |
| 7,309,450 B2 | 12/2007 | Nanao et al. | |
| 7,701,121 B2 | 4/2010 | Oka et al. | |
| 2007/0024162 A1 | 2/2007 | Shibata et al. | |
| 2007/0278904 A1 | 12/2007 | Shibata et al. | |
| 2009/0302715 A1 | 12/2009 | Shibata et al. | |
| 2010/0314972 A1* | 12/2010 | Suenaga et al. | ............... 310/360 |
| 2010/0320874 A1 | 12/2010 | Suenaga et al. | |
| 2011/0121690 A1* | 5/2011 | Shibata et al. | ............... 310/363 |
| 2011/0175488 A1* | 7/2011 | Shibata et al. | ............... 310/319 |
| 2011/0187237 A1* | 8/2011 | Suenaga et al. | ............... 310/363 |

FOREIGN PATENT DOCUMENTS

| | | |
|---|---|---|
| JP | 10286953 A | 10/1998 |
| JP | 2007019302 A | 1/2007 |
| JP | 2007-320840 A | 12/2007 |
| JP | 2007324538 | 12/2007 |
| JP | 2008263132 | 10/2008 |
| JP | 2009-295786 A | 12/2009 |
| JP | 2010-16018 A | 1/2010 |

OTHER PUBLICATIONS

Supervised by Kiyoshi Nakamura, Higher performance of piezoelectric material and advanced applied technology, published by Science & Technology in 2007, p. 150-151.

* cited by examiner

*Primary Examiner* — Jaydi San Martin
(74) *Attorney, Agent, or Firm* — Martin Fleit; Paul D. Bianco; Fleit Gibbons Gutman Bongini & Bianco PL

(57) ABSTRACT

A piezoelectric thin film element, comprising a piezoelectric thin film lamination with at least a lower electrode, a piezoelectric thin film represented by a general formula $(Na_xK_yLi_z)NbO_3$ ($0 \leq x \leq 1$, $0 \leq y \leq 1$, $0 \leq z \leq 0.2$, $x+y+z=1$), and an upper electrode disposed on a substrate, wherein the piezoelectric thin film has a crystal structure of a pseudo-cubic crystal or a tetragonal crystal or an orthorhombic crystal, or has a composition in which one of these crystals exists or at least two or more of them coexist, and is preferentially oriented to a specific axis smaller than or equal to two axes of these crystals, and in the ratio of component (001) to component (111), volume fraction of the component (001) falls within a range of 60% or more and 100% or less, and the volume fraction of the component (111) falls within a range of 0% or more and 40% or less, in a case that the total of the component (001) and the component (111) is set to be 100%.

16 Claims, 19 Drawing Sheets

(a)

(b)

(a)

(b)

(a)

(b)

(a)

(b)

PIEZOELECTRIC THIN FILM ELEMENT, AND PIEZOELECTRIC THIN FILM DEVICE

The present application is based on Japanese Patent Application No. 2009-147994, filed on Jun. 22, 2009, the entire contents of which are hereby incorporated by reference.

BACKGROUND

1. Technical Field

The present invention relates to a piezoelectric thin film element and a piezoelectric thin film device using a lithium potassium sodium niobate film, etc.

2. Description of Related Art

A piezoelectric material is processed into various piezoelectric elements in accordance with various purposes, and is widely utilized particularly as an actuator for adding voltage and generating deformation, and as functional electronic components such as a sensor that generates voltage from the deformation of an element reversely. As the piezoelectric material utilized for the purpose of the actuator and the sensor, a lead-based dielectric material having excellent piezoelectric characteristics, and particularly $Pb(Zr_{x-1}Ti_x)O_3$, which is particularly called PZT (described as PZT hereinafter)-based perovskite-type ferroelectric material has been widely used heretofore, and which is normally formed by sintering oxide composed of an individual element. Also, in recent years, development of the piezoelectric material not containing lead is desired, in consideration of an environment, and development of lithium potassium sodium niobate expressed by a general formula $(Na_xK_yLi_z)NbO_3 (0<X<1, 0<y<1, 0<z<1, x+y+z=1)$, etc, (called LKNN hereinafter), has been progressed. Such an LKNN has piezoelectric characteristics corresponding to PZT, and therefore is expected as a strong candidate. Note that LKNN includes a potassium sodium niobate film (KNN).

Meanwhile, at present, reduction in size and high performance of the piezoelectric element are strongly requested, while achieving the reduction in size and high performance of each kind of electronic component. However, regarding the piezoelectric material prepared by a sintering method-based manufacturing method, being a conventional manufacturing method, as its thickness is set to be thinner, and particularly as its thickness is set closer to a thickness of about 10 μm, the size of the piezoelectric material is closer to the size of a crystal grain constituting the material, and its influence can be hardly ignored. Therefore, there is a problem that variation of the characteristics and deterioration are remarkably generated, and in order to avoid such a problem, a forming method of the piezoelectric material, to which a thin film technique replacing the sintering method is applied, has been studied in recent years.

In recent years, a PZT thin film formed by RF sputtering is put to practical use as an actuator for a highly precise high speed inkjet printer head and a small-sized inexpensive gyro sensor (for example, see patent document 1 and non-patent document 1). Also, the piezoelectric thin film element using the piezoelectric thin film of LKNN not using lead is also proposed (for example, see patent document 2).

PATENT DOCUMENT (Patent document 1) Japanese Patent Laid Open Publication No. 10-286953
(Patent document 2) Japanese Patent Laid Open Publication No. 2007-19302

NON-PATENT DOCUMENT (Non-patent document 1)
Higher performance of piezoelectric material and application of advanced technique (published by Science & technology in 2007, under the supervision of Kiyoshi Nakamura)

By forming a lead-free piezoelectric thin film as a piezoelectric thin film, the highly precise high speed inkjet printer head with low environmental load, and the small-sized inexpensive gyro sensor can be fabricated. As its specific candidate, basic research regarding a thinner film of the LKNN has been progressed. Further, in order to achieve a lower cost in application, it is absolutely necessary to establish a technique of forming the piezoelectric thin film on a Si substrate and a glass substrate with good controllability.

However, in a conventional technique (for example, patent document 2), the orientation of the piezoelectric thin film has not been studied in detail, and therefore, the piezoelectric thin film element indicating a high piezoelectric constant can not be stably realized.

An object of the present invention is to provide a piezoelectric thin film element and a piezoelectric thin film device capable of achieving an improvement of piezoelectric characteristics.

SUMMARY OF THE INVENTION

According to an aspect of the present invention, a piezoelectric thin film element is provided, comprising a piezoelectric thin film lamination with a piezoelectric thin film represented by a general formula $(Na_xK_yLi_z)NbO_3 (0 \leq x \leq 1, 0 \leq y \leq 1, 0 \leq z \leq 0.2, x+y+z=1)$ disposed on a substrate, wherein the piezoelectric thin film has a crystal structure of a pseudo-cubic crystal or a tetragonal crystal or an orthorhombic crystal, or has a composition in which one of these crystals exists or two or more of them coexist, and is preferentially oriented to a specific axis smaller than or equal to two axes of these crystals, and in the ratio of component (001) to component (111), volume fraction of the component (001) falls within a range of 60% or more and 100% or less, and the volume fraction of the component (111) falls within a range of 0% or more and 40% or less, in a case that the total of the component (001) and the component (111) is set to be 100%.

Further according to other aspect of the present invention, a piezoelectric thin film device is provided, comprising a piezoelectric thin film lamination with a piezoelectric thin film represented by a general formula $(Na_xK_yLi_z)NbO_3 (0 \leq x \leq 1, 0 \leq y \leq 1, 0 \leq z \leq 0.2, x+y+z=1)$ disposed on a substrate, wherein the piezoelectric thin film has a crystal structure of a pseudo-cubic crystal or a tetragonal crystal or an orthorhombic crystal, or has a composition in which one of these crystals exists or two or more of them coexist, and is preferentially oriented to a specific axis smaller than or equal to two axes of these crystals, and component (001) and component (111), being components of the preferentially oriented crystal axes are in a coexistence state, and in the ratio of component (001) to component (111), volume fraction of the component (001) falls within a range of 60% or more and 100% or less, and the volume fraction of the component (111) is 40% or less, in a case that the total of the component (001) and the component (111) is set to be 100%.

According to the present invention, the piezoelectric thin film element excellent in piezoelectric characteristics, and a piezoelectric thin film device can be provided.

BRIEF DESCRIPTION OF THE DRAWINGS

FIG. 5 is a characteristic view of the KNN piezoelectric thin film according to the example 1 of the present invention, wherein FIG. 5A shows a measurement result of a wide-angle X-ray reciprocal space mapping, and FIG. 5B shows a simulation example of the wide-angle X-ray reciprocal space mapping.

FIG. 6 is a characteristic view of the KNN piezoelectric thin film (KNN-1) according to the example 1 of the present invention, wherein FIG. 6A shows an example of the measurement result by a two-dimensional position sensitive wire grid X-ray detector, and FIG. 6B shows a reflected X-ray profile induced by (111) and (001) obtained by integration computation along the x-axis in (110) diffraction.

FIG. 7 is a characteristic view of the KNN piezoelectric thin film (KNN-2) according to the example 1 of the present invention, wherein FIG. 7A shows an example of the measurement result by the two-dimensional position sensitive wire grid X-ray detector, and FIG. 7B shows the Reflected X-ray profile induced by (111) and (001) obtained by integration computation along x-axis in the (110) diffraction.

FIG. 8 is a characteristic view of the example 1, wherein FIG. 8A is a stereographic projection view of a pole figure, and FIG. 8B shows a graph in which the stereographic projection view of the pole figure is converted to an orthogonal coordinate.

FIG. 9 shows the pole figure of example 2, wherein FIG. 9A shows a model of the pole figure (110) with (001) orientation as a pole, and FIG. 9B shows a model of the pole figure (110), with (111) orientation as a pole.

FIG. 10 is a view showing the characteristics of the X-ray diffraction profile of the example 2 of the present invention, wherein FIG. 10A shows an example of performing fitting analysis to the measurement result of the X-ray diffraction profile shown in FIG. 6 and FIG. 7, and FIG. 10B shows an example of an analysis result of a volume fraction of (001) and (111), in consideration of a correction coefficient.

FIG. 11 is a sectional view of the KNN piezoelectric thin film element of example 3 of the present invention, wherein FIG. 11A is a conceptual view of the KNN piezoelectric thin film as a highly oriented film, and FIG. 11B is a conceptual view showing a state that in the KNN piezoelectric thin film with high orientation, crystal grains are inclined to a substrate surface.

DETAILED DESCRIPTION OF THE EMBODIMENT

Figure 1:
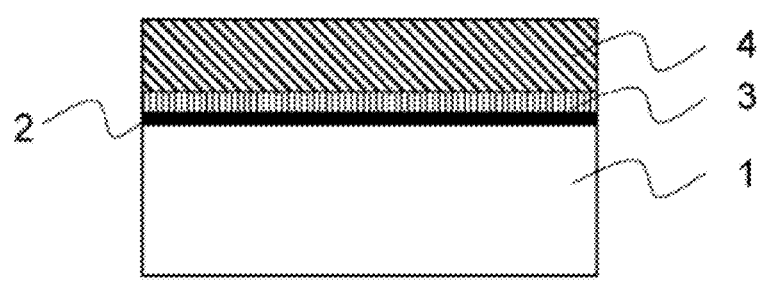
FIG. 1 is a sectional view of a piezoelectric thin film element using a piezoelectric thin film according to example 1 of the present invention.
Figure 2:
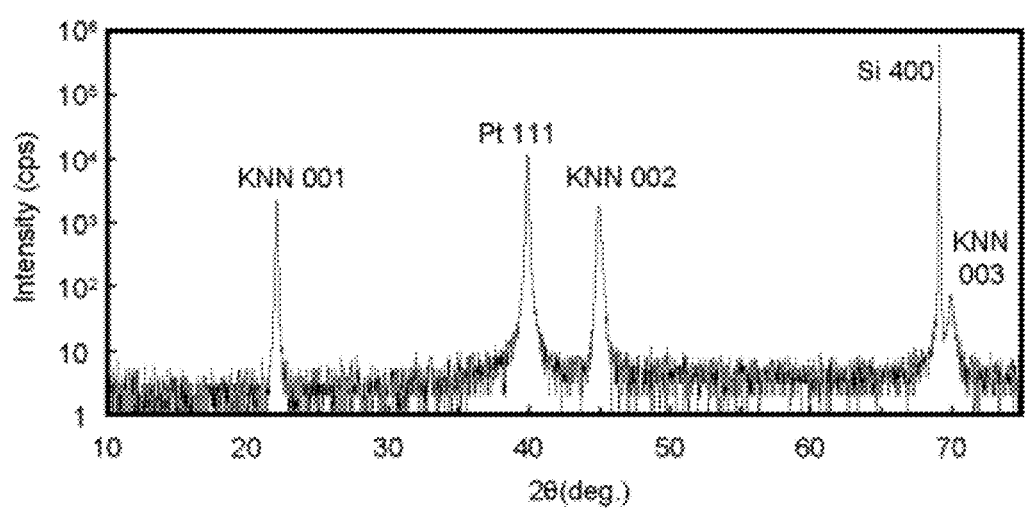
FIG. 2 is a view showing an example of an X-ray diffraction pattern of 2θ/θ scan in the piezoelectric thin film element according to the example 1 of the present invention.

Preferred embodiments of a piezoelectric thin film element according to the present invention will be described hereinafter.

Summary of the Embodiment

Inventors of the present invention obtains a knowledge that in a lead-free based piezoelectric thin film, being a basic part of a piezoelectric element, the piezoelectric thin film element and a piezoelectric thin film device showing a high piezoelectric constant can be realized, by quantitatively and precisely controlling a crystal orientation which is not examined by a conventional technique.

If a crystal orientation of a piezoelectric thin film is not quantitatively and precisely controlled or managed, a high piezoelectric constant can not be obtained, and due to different crystal orientation depending on a part, the piezoelectric constant becomes non-uniform in an element device. According to an embodiment of the present invention, by defining a volume fraction of components (001) and (111) of a crystal axis of a preferentially oriented piezoelectric thin film by suitably selecting the piezoelectric thin film, etc, and controlling film forming conditions such as a film forming temperature of the piezoelectric thin film, the piezoelectric thin film element with high piezoelectric characteristics and a manufacturing method of the same can be realized.

(A Basic Structure of the Piezoelectric Thin Film Element)

The piezoelectric thin film element according to this embodiment has a lamination structure composed of a substrate, an oxide film formed on a surface of the substrate; a lower electrode layer formed on the oxide film; a piezoelectric thin film formed on the lower electrode; and an upper electrode layer formed thereon.

This piezoelectric thin film is made of $ABO_3$-type oxide having a perovskite structure, and as its composition, A is one or more elements selected from Li, Na, K, Pb, La, Sr, Nd, Ba, and Bi, B is one or more elements selected from Zr, Ti, Mn, Mg, Nb, Sn, Sb, Ta, and In, and O is oxygen.

As the substrate, one kind of substrate selected from any, one of Si substrate, MgO substrate, ZnO substrate, $SrTiO_3$ substrate, $SrRuO_3$ substrate, glass substrate, quartz glass substrate, GaAs substrate, GaN substrate, sapphire, substrate, Ge substrate, and stainless substrate. Particularly, an inexpensive and industrially proven Si substrate is preferable.

As the oxide film formed on the surface of the substrate, a thermal oxide film formed by thermal oxidation, and a Si oxide film formed by CVD (Chemical Vapor Deposition), etc, can be given. Note that without forming the oxide film, the lower electrode layer such as a Pt electrode may be directly formed on the oxide substrate such as a quartz glass ($SiO_2$), MgO, $SrTiO_3$, and $SrRuO_3$ substrates.

Preferably, the lower electrode layer is a layer containing Pt or an alloy mainly composed of Pt, or has a lamination structure of them. Further, in the lower electrode layer, orientation is preferably formed in (111) plane, and an adhesive layer for enhancing adhesion to the substrate may be provided between the substrate and the electrode layer made of Pt or the ally mainly composed of Pt. A Pt thin film oriented to (111) plane also functions as a base layer of the piezoelectric thin film.

The piezoelectric thin film is preferably the piezoelectric thin film with an $ABO_3$ type oxide, namely a perovskite-type oxide as a main phase, which is represented by potassium sodium niobate and lithium potassium sodium niobate (called LKNN hereinafter), namely expressed by a general formula $(Na_xK_yLi_z)NbO_3 (0<X<1, 0<y<1, 0<z<1, x+y+z=1)$. The LKNN thin film may also be doped with prescribed amount of Ta and V. The piezoelectric thin film is formed by using an RF sputtering method, an ion beam sputtering method, or the CVD method. In this embodiment, the RF sputtering method is used.

[Crystal Orientation of the Lower Electrode Layer]

Incidentally, conventionally, regarding the crystal orientation of the LKNN film, detailed analysis and precise control based on this analysis have not been performed. Namely, it has been remained to be unclear heretofore, whether the crystal orientation of the piezoelectric thin film is in a random orientation state, or whether only one axis is in a vertically preferential orientation state with respect to the Si substrate surface, or to what degree of ratio, specific two axes or more than two axes are in the preferential orientation state. In other words, regarding the crystal orientation, being one of the characteristic determining factors of the piezoelectric thin film, exact quantification for finding out slight variation is not performed, and the piezoelectric thin film is fabricated based on a qualitative evaluation result. Therefore, a desired high piezoelectric constant can not be obtained with good reproducibility.

Actually, regarding the LKNN film in this preferential orientation state (001), its piezoelectric characteristics are different per every film forming spot or every production lot. The reason is that it becomes difficult to strictly control the orientation to each crystal plane and cause a crystal growth to occur, because small variation in (001) orientation of the piezoelectric film can not be formed and detailed analysis has not been performed, regarding the (110), (111), and (210) orientations including the (001) orientation.

For example, by increasing electric power application during film formation by sputtering, a plurality of sputter grains are forcibly driven onto the substrate in a constant direction, by an impact of energy grains such as Ar ion, and as a result, the piezoelectric thin film is formed, having polycrystalline grains largely inclined in a normal line direction on the substrate surface. At this time, a crystal orientation state can be confirmed to be approximately in a (001) orientation state preferentially, by a conventional X-ray diffraction method called a generally-known $2\theta/\theta$ scan. However, in this measurement, a position of a sample is fixed excluding the axis ($\theta$) of a diffraction angle, and therefore, an actual crystal orientation can not be evaluated. As a result, the inventors of the present invention obtains a knowledge that a coexistence state of other crystal orientation component remains unclear, and a measurement result expressing a strict orientation can not be obtained, and therefore, deterioration of the piezoelectric characteristics caused by structure can not be grasped, and as a result, further improvement of the piezoelectric constant and stable production of the piezoelectric thin film can not be realized.

Control of the Crystal Orientation According to an Embodiment

By the above-described knowledge, crystal orientations of the Pt thin film and the piezoelectric thin film were controlled. (The Crystal Orientation of the Pt Thin Film)

Therefore, in order to strictly manage and control the crystal orientation of the LKNN film, first, optimization of the film forming temperature, film forming gas, and degree of vacuum was performed, so as to stably realize crystallinity of the Pt thin film of the lower electrode, being an initial crystal growth surface of the piezoelectric thin film. As a film forming condition, first, the film forming temperature was studied, and it was found that a film forming range of 100 to 500° C. was a range of an optimal temperature, as the condition of setting the (111) preferential orientation.

In order to further improve smoothness of a Pt surface, by forming a Ti layer with smooth surface having 0.1 to several nm thickness and forming the Pt electrode thereon, a surface roughness of the Pt lower electrode can be reduced and controlled to a size of several nm.

Further, by precisely controlling the film thickness of the Pt lower electrode layer, surface irregularities of the Pt lower electrode layer can be made small, and the Pt lower electrode layer, being a polycrystalline, can be formed by controlling so that a size of the crystal grain becomes uniform.

The lower electrode layer has a structure of a single layer in which the crystal orientation is preferentially oriented in a vertical direction with respect to the substrate surface or has a lamination structure. The lower electrode layer may be a layer of not only Pt but also an alloy mainly composed of Pt, or may be a thin film having a lamination structure of them mainly composed of Pt (Pt thin film). Further, the lower electrode may also include a layer of Ru, Ir, Sn, and In or an oxide of them or a compound with elements contained in the piezoelectric thin film. In such a case also, in the same way as a case of the Pt thin film, by optimizing the film forming temperature and the film forming gas, the crystallinity of the lower electrode thin film, being a base of the LKNN thin film, can be stably realized.

Further, as candidates for the substrate that forms such lower electrode thin films, crystal, amorphous Si, MgO, ZnO, $SrTiO_3$, $SrRuO_3$, glass, quartz glass, GaAs, GaN, sapphire, Ge, and stainless, or a complex of them is preferable, and regarding the element with the adhesive layer and the lower electrode layer formed on such substrates, and the LKNN film formed thereon, the crystal orientation of the LKNN film was compared in detail, and selection of the substrate capable of strictly controlling the preferential orientation was carried out.

[Crystal Orientation of the Piezoelectric Thin Film]

Further, according to this embodiment, in order to surely realize the preferential orientation of the LKNN film, regarding the film forming temperature of the LKNN film itself, the kind of sputtering gas, pressure of the gas, degree of vacuum, electric power application, and heat treatment after film formation, the inventors of the present invention found film forming conditions of the piezoelectric thin film having crystal orientation capable of improving piezoelectric characteristics, and by optimizing these conditions, the improvement of the piezoelectric characteristics is achieved. Regarding these conditions, by strictly studying on the film forming conditions, evaluation, and a managing method, etc, for every apparatus or under various environments, the LKNN thin film having a pseudo-cubic crystal with preferential orientations to (001) and (111), or preferential orientation in which both of them coexist, can be formed with good reproducibility.

Next, in order to strictly control the preferential orientation of the LKNN film itself of polycrystalline or epitaxially grown single crystal, the film forming temperature is precisely set to be always constant, for example, so that the orientation component (001) and the orientation component (111) fall within a constant ratio. As a heating apparatus in actual film formation, by using thermal radiation by an infrared lamp, or thermal conduction by heating using heater through a heat exchanger plate, the temperature is set so as to fall within a range of an optimal component ratio of the crystal orientation.

Further, under the aforementioned conditions, each kind of orientation component including orientations (001) and (111), being a crystal structure, is strictly controlled by deciding sputtering electric power application and the pressure and the flow rate of the gas introduced into the film forming apparatus, to be optimal values and by selecting proper gas species. Then, it is possible to expect an effect that the LKNN film showing high piezoelectric constant can be stably obtained with good reproducibility. Further, similar effects can be expected by changing a density of a sputtering target material in accordance with the above-described circumstances.

The LKNN film thus obtained has a texture composed of columnar crystal grains. Further, when the lower electrode layer is formed, having orientation to (111) plane, the piezoelectric thin film layer is formed in such a manner as being preferentially oriented in a prescribed direction on the lower electrode layer.

Preferably, in the piezoelectric thin film layer, at least one or more of the preferentially oriented crystal grains (001), the preferentially oriented crystal grains (110), and the preferentially oriented crystal grains (111) are in a coexistence state. By realizing such a state of the crystal orientation, the piezoelectric characteristics can be improved by controlling an internal stress. Further, by alleviating the stress, film peeling can be suppressed, thus making it possible to improve mechanical strength of the piezoelectric thin film, and the piezoelectric thin film excellent in processing easiness can be provided.

Figure 16:
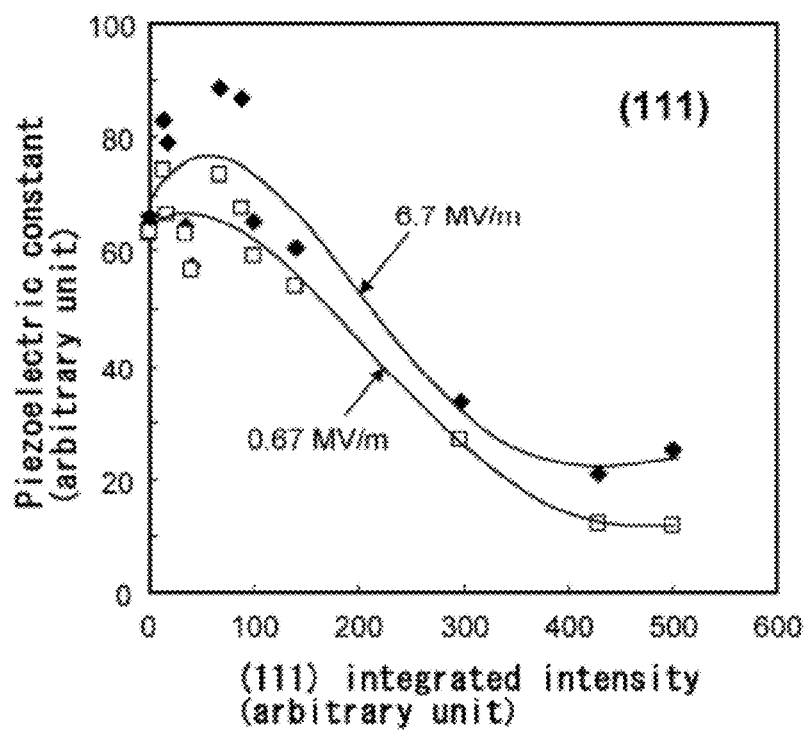
FIG. 16 is a correlation view between (111)-induced integrated intensity and a piezoelectric constant of the piezoelectric thin film, in the piezoelectric thin film element using the piezoelectric thin film according to example 5 of the present invention.
Figure 17:
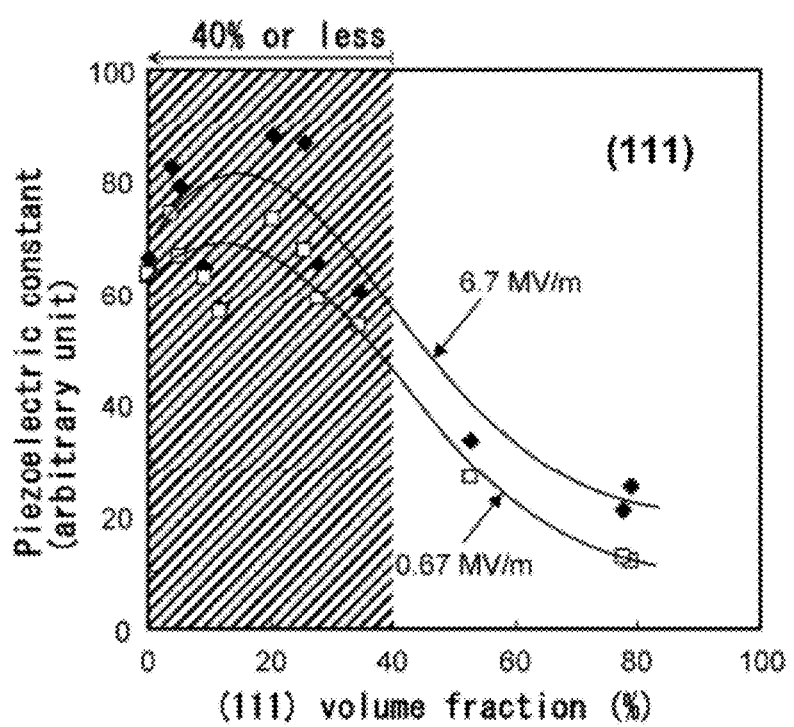
FIG. 17 is a correlation view between volume fraction and the piezoelectric constant of orientation component (111) of the piezoelectric thin film, in the piezoelectric thin film element using the piezoelectric thin film according to the example 5 of the present invention.
Figure 18:
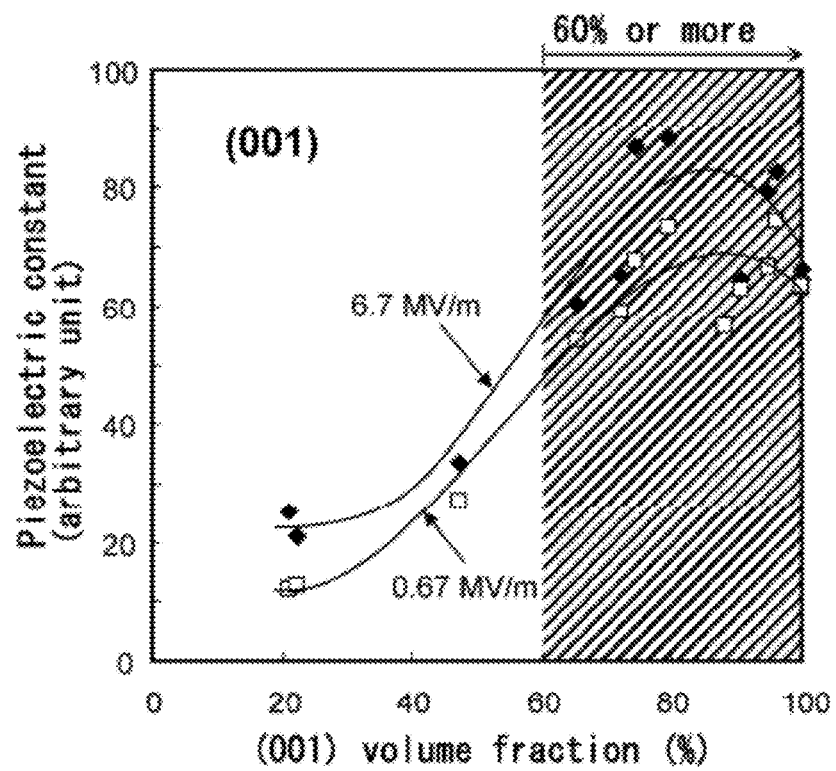
FIG. 18 is a correlation view between the volume fraction and the piezoelectric constant of the orientation component (001) of the piezoelectric thin film, in the piezoelectric thin film element using the piezoelectric thin film according to example 5 of the present invention.

The piezoelectric thin film constituting the piezoelectric thin film element of example 1 has a state of having the pseudo-cubic crystal or a tetragonal crystal or an orthorhombic crystal, or has a state that one of these crystals exists or at least two or more of them coexist. Further, the piezoelectric thin film is preferentially oriented to a specific axis smaller than or equal to two axes of these crystals. In addition, in the ratio of the component (001) to the component (111) as the component of the crystal axis oriented as described above, volume fraction of the component (001) falls within a range of 60%-100%, and the volume fraction of the component (111) falls within a range of 0%-40%, in a case that the total of the component (001) and the component (111) is set to be 100%. With such a structure, it is possible to prevent the crystal orientation from becoming random or the piezoelectric constant from decreasing due to increase of an internal distortion (FIG. 16 to FIG. 18 of example 5).

Figure 13:
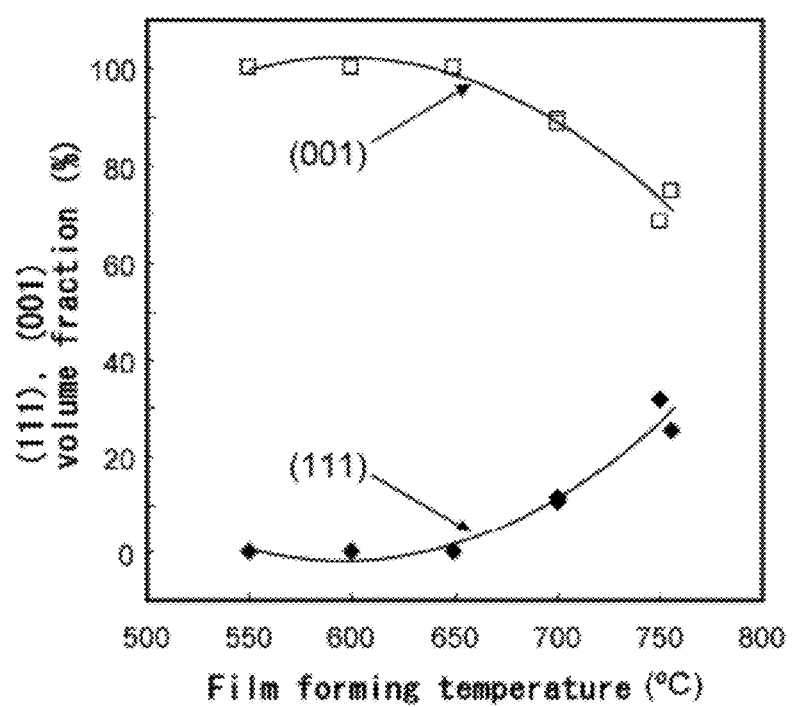
FIG. 13 is a view showing a variation of the orientation component (001) and the orientation component (111), with respect to the film forming temperature in forming the KNN piezoelectric thin film according to example 4 of the present invention by sputtering.

It is possible to define a state that the volume fraction of the component (001) of the aforementioned piezoelectric thin film falls within the range of 60 to 100%, or the volume fraction of the component (111) falls within the range of 0 to 40%, by controlling the film forming conditions of the piezoelectric thin film, such as the film forming temperature (FIG. 13 of example 4).

[Distortion of the Piezoelectric Thin Film]

Figure 14:
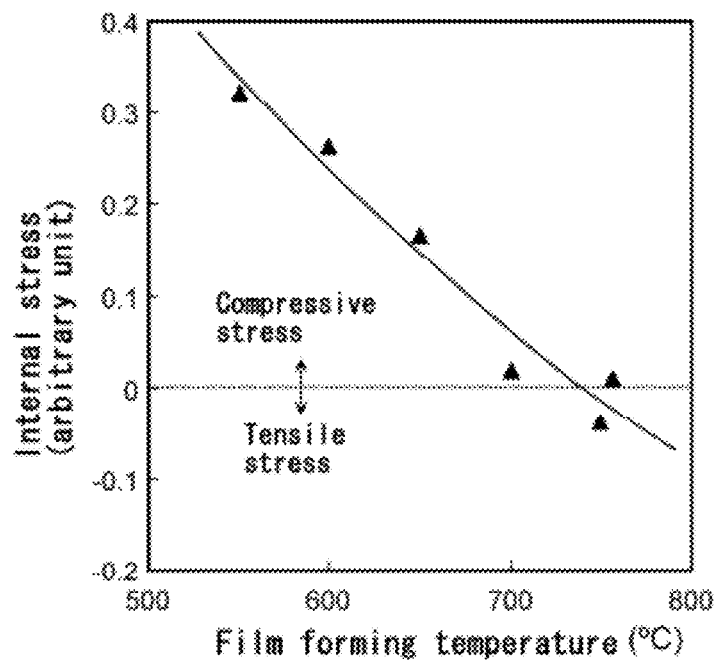
FIG. 14 is a view showing the variation of an internal stress, with respect to the film forming temperature in forming the KNN piezoelectric thin film according to the example 4 of the present invention by sputtering.

It is possible to provide distortion in a tensile stress state in a parallel direction to the substrate surface, or provide distortion in a compressive stress state in the parallel direction to the substrate surface, by controlling the ratio of the component (volume fraction) of the crystal orientation of the piezoelectric thin film. By controlling the volume fraction, the piezoelectric thin film can be set in a distortion free condition having no internal stress. Further, by controlling the volume fraction, the piezoelectric thin film can have an inhomogeneous distortion in a vertical direction or a parallel direction, or in both directions to the substrate surface (FIG. 13 and FIG. 14 of example 4). Thus, by controlling the volume fraction of the piezoelectric thin film, the internal stress of the piezoelectric thin film can be controlled, and the piezoelectric thin film having a desired internal stress can be obtained.

[Piezoelectric Thin Film Device]

By forming the upper electrode layer in an upper part of the piezoelectric thin film layer, on the substrate attached with the piezoelectric thin film according to the above-described embodiment, the piezoelectric thin film element showing high piezoelectric constant can be fabricated, and by molding this piezoelectric thin film element device into a prescribed shape, or providing a voltage application part and a voltage detection part, the piezoelectric thin film device such as each kind of actuator and sensor can be fabricated.

Figure 22:
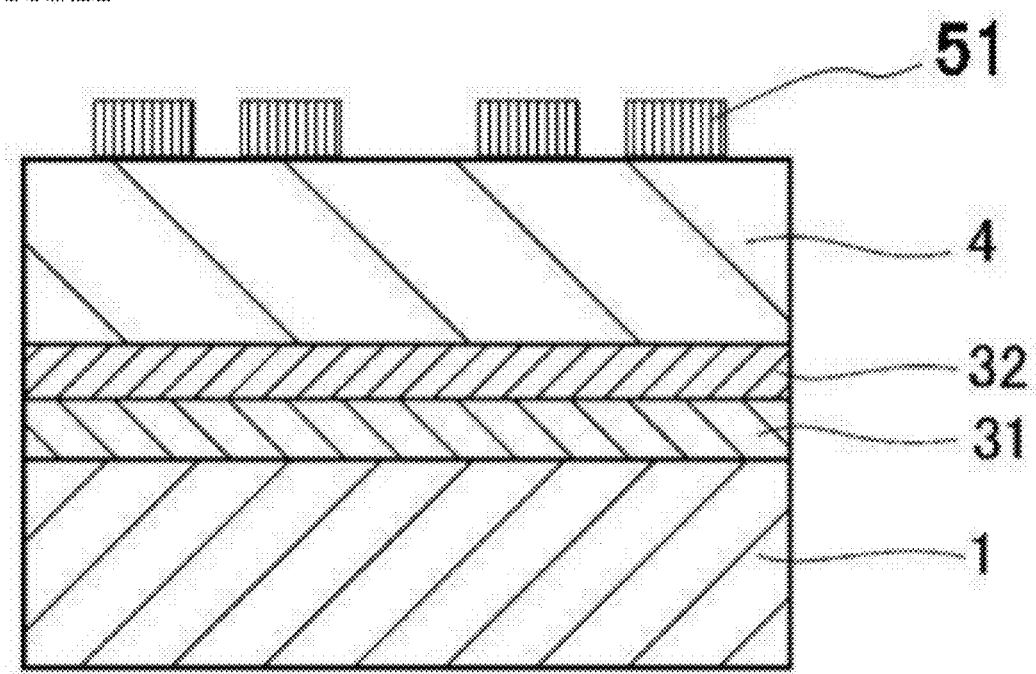
FIG. 22 is a sectional view of a filter device using the piezoelectric thin film of the first embodiment of the present invention.

Further, as shown in FIG. 22, by forming a pattern electrode 51 having a prescribed pattern in an upper part of the piezoelectric thin film 4, a filter device using a surface elastic wave can be formed on the substrate with piezoelectric thin film according to the aforementioned embodiment.

Note that in the filter device using the surface elastic wave, a lower electrode layer (Pt thin film) 32 formed on an adhesive layer 31 functions mainly as a base layer.

Similarly to the lower electrode layer, the upper electrode layer forming the upper part of the piezoelectric thin film, or the pattern electrode having a prescribed pattern is preferably an electrode layer of Pt or an alloy mainly composed of Pt, or an electrode layer having a lamination structure including these electrode layers mainly composed of Pt, or may be an electrode layer of Ru, Ir, Sn, In or the oxide of them or the compound with the elements contained in the piezoelectric thin film.

Advantages of the Embodiments

The present invention has one or more advantages as will be given hereinafter.

(1) According to one or more embodiments of the present invention, the LKNN piezoelectric thin film has a crystal structure of a pseudo-cubic crystal or a tetragonal crystal or an orthorhombic crystal, or has a state in which one of these crystals exists or at least two or more of them coexist, and is preferentially oriented to a specific axis smaller than or equal to two axes of these crystals, and in the ratio of component (001) to component (111), volume fraction of the component (001) falls within a range of 60%-100%, and the volume fraction of the component (111) falls within a range of 0%-40%, in a case that the total of the component (001) and the component (111) is set to be 100%. Therefore, the crystal orientation is prevented from becoming random and the piezoelectric constant is prevented from being decreased due to increase of the internal distortion.

(2) According to one or more embodiments of the present invention, the piezoelectric characteristics can be improved, by properly selecting the piezoelectric thin film, the electrode, the substrate, and the adhesive layer, and optimizing the film forming conditions of these materials, then precisely measuring degrees of the crystal orientation of the piezoelectric thin film thus obtained to perform exact quantification of the crystal orientation, thus strictly controlling an atomic level structure of the piezoelectric thin film. As a result, a high performance piezoelectric thin film device can be realized and simultaneously a manufacturing yield of this device can be improved.

(3) Further, according to one or more embodiments of the present invention, the crystal grains preferentially oriented to (001) and the crystal grains preferentially oriented to (111) are in a coexistence state. Therefore, the piezoelectric characteristics can be improved by controlling the internal stress. Further, the film peel can be suppressed by alleviating the stress, and therefore the mechanical strength of the piezoelectric thin film is improved, and the piezoelectric thin film excellent in processing easiness can be provided.

(4) Further, according to one or more embodiments of the present invention, by using Pt electrode with controlled crystal orientation, or Pt alloy, or Ru, Ir, and the oxide of them, and the compound with the elements contained in the piezoelectric thin film, highly precise control of the crystal orientation of the piezoelectric thin film formed in the upper part and the improvement of an environment tolerance as an element are possible.

(5) Further, according to one or more embodiments of the present invention, by using the MgO substrate, ZnO substrate, $SrTiO_3$ substrate, $SrRuO_3$ substrate, glass substrate, quartz glass substrate, GaAs substrate, GaN substrate, sapphire substrate, Ge substrate, and stainless substrate, other than Si substrate, as the substrate, the crystal orientation of the piezoelectric thin film formed thereon can be controlled.

(6) According to one or more embodiments of the present invention, the piezoelectric thin film having excellent piezoelectric characteristics can be realized, and therefore a high quality piezoelectric thin film element can be obtained, with high fabrication yield.

(7) Further, according to one or more embodiments of the present invention, the piezoelectric thin film element is provided, including a thin film not using lead. Therefore, by mounting this piezoelectric thin film element, an environmental load can be reduced, and high performance small sized devices such as small-sized motor, sensor, and actuator, for example, MEMS (Micro Electro Mechanical System) can be realized. Further, the filter device is realized, having excellent filter characteristics using the surface elastic wave.

(8) Further, according to one or more embodiments of the present invention, when the actuator and the sensor are fabricated by using the Si substrate, the crystal orientation is quantitatively and precisely controlled and managed, in the lead-free based piezoelectric thin film used in a base part of the piezoelectric element. Therefore, the lead-free based device having a long service life and showing a high piezoelectric constant can be stably produced. Also, in the element, the crystal orientation is not different depending on apart. Therefore, the piezoelectric constant of the piezoelectric thin film formed on the substrate becomes uniform, and the fabrication yield in manufacture can be improved.

(9) Further, according to one or more embodiments of the present invention, improvement of the piezoelectric characteristics by controlling the orientation using LKNN, etc, can be achieved.

(10) Further, according to one or more embodiments of the present invention, by stably controlling the crystal orientation of the piezoelectric thin film, it is possible to realize improvement and stabilization of the piezoelectric thin film element or the piezoelectric thin film device. Therefore, a high performance micro device can be provided at a low cost.

(11) Further, according to one or more embodiments of the present invention, the piezoelectric thin film element and the piezoelectric thin film device excellent in piezoelectric characteristics are provided, wherein atomic level structure of the piezoelectric thin film such as LKNN is highly precisely controlled.

Example 1

Next, examples of the present invention will be described.

Example 1

Examples will be described by using FIG. 1 to FIG. 8.

FIG. 1 is a sectional view showing an outline of the substrate attached with the piezoelectric thin film. In this example, an adhesive layer 2 is formed on a Si substrate 1 having an oxide film, and the piezoelectric thin film element is fabricated, with a lower electrode layer 3 and a piezoelectric thin film layer 4 of KNN having a perovskite structure sequentially formed on the upper part of this adhesive layer 2.

At this time, the piezoelectric thin film layer 4 has the pseudo-cubic crystal or the tetragonal crystal or the orthorhombic crystal, and may have a composition in which at least one or more of them have crystal or amorphous $ABO_3$ or have a composition in which both of them are mixed. Here, A is one or more kinds of elements selected form a group consisting of Li, Na, K, Pb, La, Sr, Nd, Ba, and Bi, and B is one or more kinds of elements selected from Zr, Ti, Mn, Mg, Nb, Sn, Sb, Ta, and In, and O is oxygen. A piezoelectric material of site A can be constituted including Pb. However, the piezoelectric thin film not containing Pb is desired from an aspect of environment.

Further, as the lower electrode layer 3, a Pt alloy or an alloy containing Ir and Ru may be acceptable. At this time, the state of the crystal orientation of the piezoelectric thin film is varied depending on the film forming conditions, and the internal stress (distortion) of the piezoelectric thin film is also sometimes changed to the compressive stress or the tensile stress. Moreover, there is also a case such as a non-stressed state, namely a distortion free condition.

A manufacturing method of the piezoelectric thin film element will be described hereinafter. First, a thermal oxide film was formed on the surface of the Si substrate 1, and the lower electrode layer 3 was formed thereon. The Si substrate is a circular shaped Si substrate of 4 inches. Further, an oxide film is formed, having size of 100 to 200 nm. At this time, as the substrate 1, the substrate selected any one of the MgO substrate, ZnO substrate, SrTiO$_3$ substrate, SrRuO$_3$ substrate, glass substrate, quartz glass substrate, GaAs substrate, GaN substrate, sapphire substrate, Ge substrate, and stainless substrate may be acceptable.

The lower electrode layer 3 is composed of a Ti film having a thickness of 2 nm formed as the adhesive layer 2, Pt or an Au thin film having a thickness of 100 nm formed on the Ti film as the electrode layer, or the lamination of them or a thin film of an alloy of them. This electrode layer was formed by using a sputtering method. A metal target was used as a sputtering target 12 shown in FIG. 19, and a sputtering electric power application during film formation was set to be 100 W, and 100% Ar gas or O$_2$ mixed gas, or gas obtained by mixing at least one or more inert gases such as He or Ne or Kr or N$_2$ is used as sputtering gas. Further, a substrate temperature was set to be 350° C. during film formation, and a thin film, being a polycrystalline thin film, made of Pt and Au was formed.

Next, the KNN thin film was formed on this lower electrode layer as the piezoelectric thin film layer 4. The KNN thin film was also formed by using the sputtering method. The substrate was heated, with the temperature set in a range of 700 to 730° C., during formation of the KNN thin film, and sputtering film formation was executed by 5:5 mixed gas of Ar and O$_2$ or a mixed gas of inert gases of at least one or more of Ar, He or Ne or Kr or N$_2$, etc. Further, as the target, a ceramic target expressed by (Na$_x$K$_y$Li$_z$)NbO$_3$ wherein x=0.5, y=0.5, and z=0, was used. Distance between the target and sputtering is 50 mm. The film formation was performed until the film thickness became 3 μm. Moreover, even after the film formation, heating treatment was performed in oxygen atmosphere or inert gas atmosphere, or in the mixed gas of both of them, or in the atmosphere or in a vacuum atmosphere.

When a sectional shape of the KNN film thus fabricated was observed by using a scanning electron microscope, it was found that its texture was formed into a columnar structure. As a result of observing the crystal structure by a conventional X-ray diffractometer, as shown in an X-ray diffraction pattern (2θ/θ scan measurement) of FIG. 2, it was found that the thin film oriented to the (111) plane vertically to the substrate surface was formed on the Pt thin film of the example 1 which was formed by heating the substrate.

Figure 3:
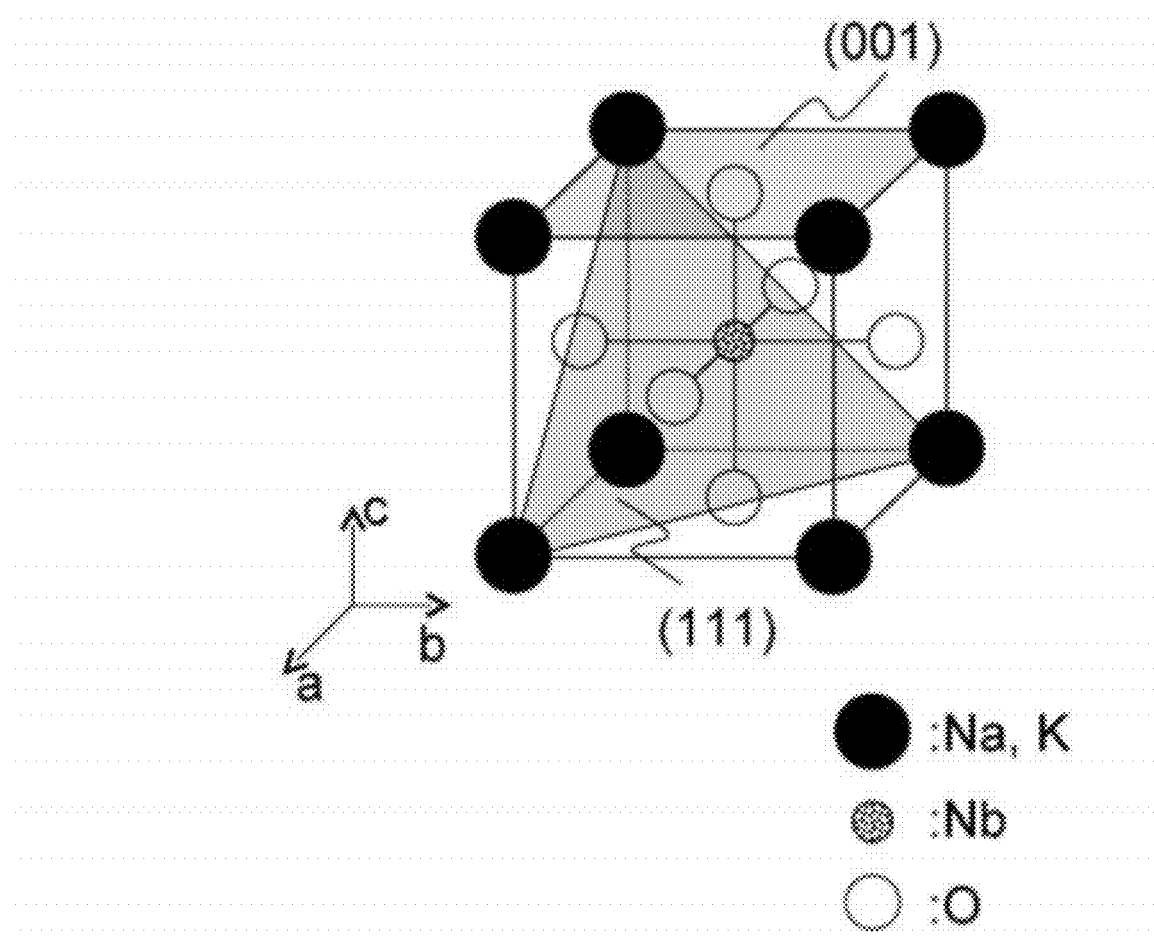
FIG. 3 is a view showing a crystal structure of a KNN piezoelectric thin film according to the example 1 of the present invention.

As a result of forming the KNN film on the Pt film preferentially oriented to (111) plane, it was found that the fabricated KNN thin film was a polycrystalline thin film having a perovskite type crystal structure having the pseudo-cubic crystal as shown in FIG. 3. Also, as is clarified from the X-ray diffraction pattern of FIG. 2, only diffraction peaks of (001), (002), and (003) can be confirmed. Therefore, it can be estimated that the KNN piezoelectric thin film is substantially preferentially oriented to (001) plane.

In this example 1, in order to precisely evaluate the orientation of the KNN thin film in detail, for the KNN piezoelectric thin film, wherein the crystal orientation was forcibly controlled, a pole figure was measured. The pole figure is a view in which a spread of a pole on a specific lattice surface is stereoscopically projected, which is an analysis method capable of evaluating the state of a polycrystalline orientation in detail. Specifically, see cited reference 1 (revised 4-th version of Guide to X-ray diffraction edited by Rigaku Corporation, (Rigaku Corporation 1986), and cited reference 2 (written by Carity, Introduction to X-ray diffraction, (by AGNE 1980)).

A definition of the preferential orientation can be clarified by the measurement of the pole figure. Regarding a polycrystalline substance (including a thin film), when the individual crystal grain is in a "preferentially oriented state" in a certain specific direction, a local distribution of Reflected X-ray, such as spot-shaped or ring-shaped Debye ring can be inevitably found out at a certain angular degree, in the measurement of the pole figure of this substance.

Meanwhile, when the each crystal grain of this substance exists in an arbitrary direction, in other words, when the crystal grain exists in a "random orientation", the spot-shaped or ring-shaped Reflected X-ray can not be found out in the pole figure. Whether or not this piezoelectric thin film is preferentially oriented is determined, depending on presence/absence of such Reflected X-ray, and this is a definition of the presence of the preferential orientation.

In a structure analysis in the piezoelectric thin film element of this example 1, "D8 DISCOVER with Hi Star, VANTEC2000 (registered trademark)" produced by Bruker AXS corporation, being a high output X-ray diffractometer was used, on which two-dimensional position sensitive wire grid detector having an X-ray detection area of a large area was mounted. In this example, the pole figure, with (110) of the KNN thin film as a pole, was measured.

Figure 4:
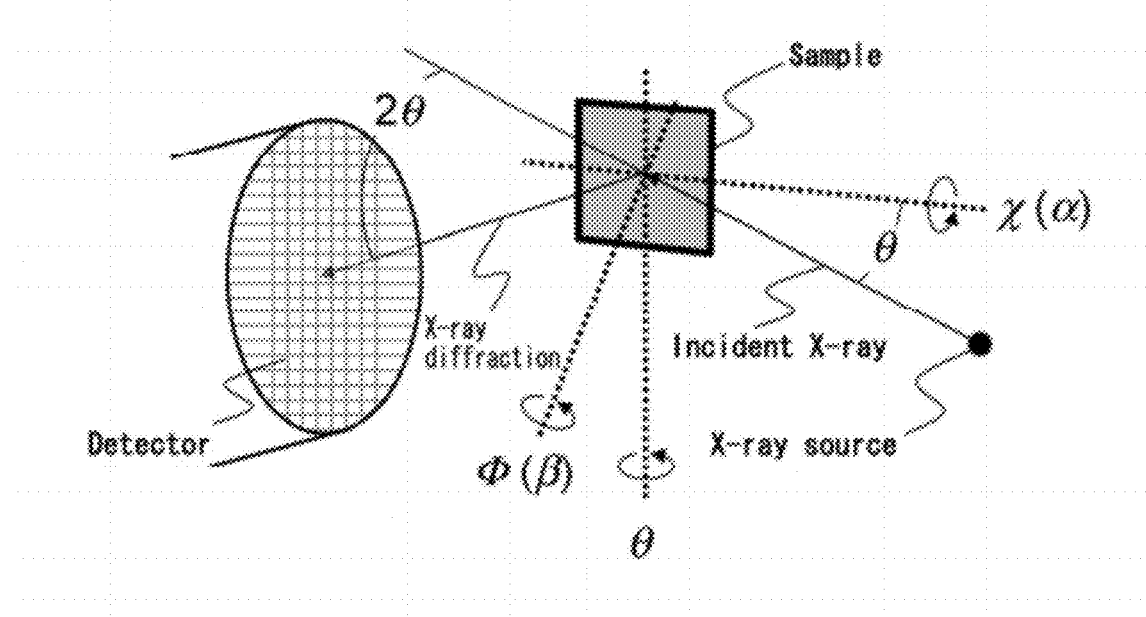
FIG. 4 is an experimental arrangement view of the KNN piezoelectric thin film according to the example 1 of the present invention measured by a pole figure measurement.

FIG. 4 is a conceptual view of an arrangement for measuring the pole figure performed by this example. This is a method called Schulz reflection method. In a conventional measurement of the pole figure, a zero-dimensional X-ray detector is used in many cases, and therefore the χ(α) axis and the Φ(β) axis shown in FIG. 4 need to be simultaneously scanned, thus requiring a long time accordingly in measurement. However, in this example, a large area two-dimensional detector (D8DISCOVER with HiStar, VANTEC2000 (registered trademark)) is used. Therefore, two axis scanning using zero-dimensional detector is almost not necessary, thereby making it possible to perform measurement in a short time. Accordingly, a large volume of analysis results of the crystal orientation of the KNN thin film fabricated under various conditions, can be obtained speedily, and the KNN piezoelectric thin film having the crystal structure of this example can be realized.

Figure 5:
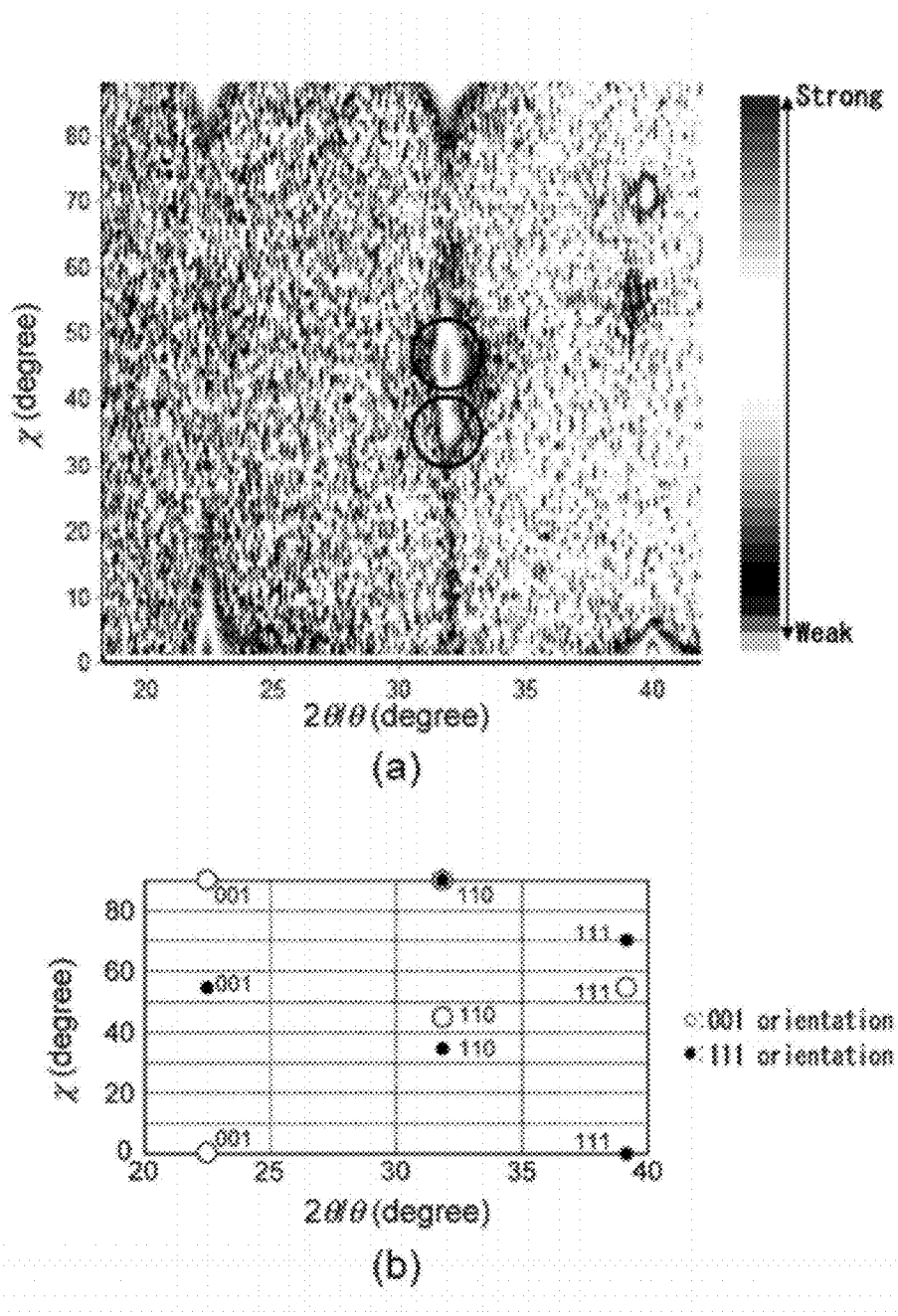

FIG. 5 shows the analysis result of a wide angle X-ray reciprocal space mapping in the piezoelectric thin film of the example 1. An X-ray diffraction angle, being 2θ/θ, is taken on the horizontal axis, and the vertical axis is the χ axis in a vertical direction with respect to the axis (2θ/θ) of the diffraction angle shown in FIG. 4. Further, a right-lateral bar graph shows an intensity of the Reflected X-ray by monochromatic gradation, and it is given as a guide of the intensity of the Reflected X-ray on this map.

FIG. 5A shows an actual analysis result of KNN, and FIG. 5B shows a result of the reciprocal lattice point simulation in the KNN thin film having (001)/(111) orientations, for comparison. ○ indicates X-ray diffraction from the (001) oriented KNN thin film, and ● indicates the X-ray diffraction from the (111) oriented KNN thin film. A simulation program used at this time is SMAP/for Cross Sectional XRD-RSM provided by Bruker AXS.

As is clarified from the comparison of both figures, in an angle 2θ/θ corresponding to 110 diffractions at about 32°, it is possible to confirm two diffractions out of 110 diffractions in the (001) orientation and the (111) orientation from 15° to 75°, with χ=45° as a center. This analysis result suggests the coexistence of the (001) and (111) orientations in this piezoelectric thin film. An X-ray diffraction profile in the χ-axis direction can not be measured only by a normal X-ray, diffraction measurement of 2θ/θ scan. Therefore, the analysis result in this example shows an example of finding-out a new one parameter of structural parameters related to an improvement of the characteristics of the piezoelectric thin film.

Figure 6:
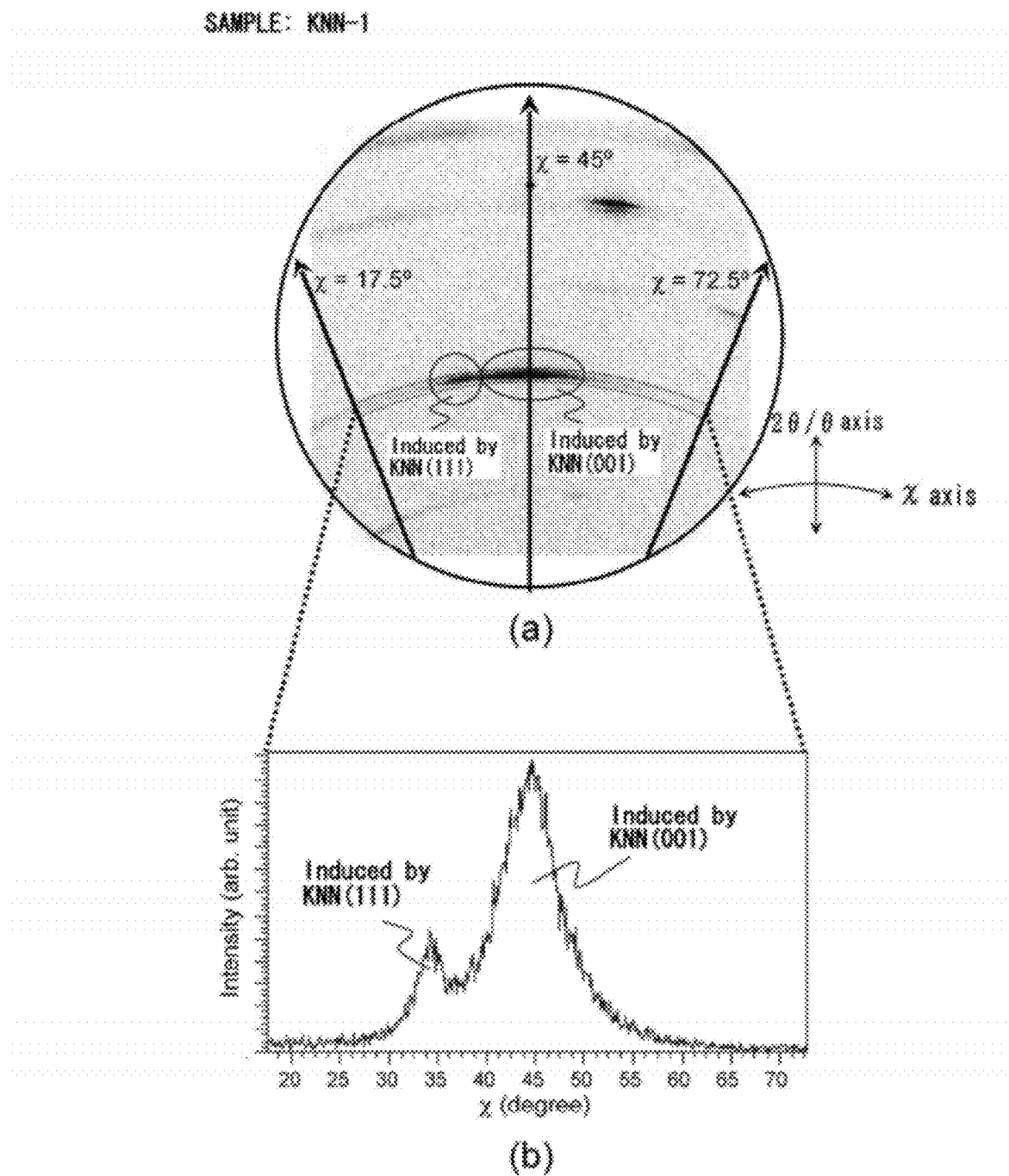

FIG. 6 shows a measurement result of an actual X-ray diffraction of the piezoelectric thin film according to the example 1. FIG. 6A shows the X-ray diffraction from a sample KNN-1 measured in an X-ray two-dimensional detector, wherein black spot patterns, which are formed into an arch, correspond to the reflection of the X-ray diffraction. Further, the direction of forming the arc corresponds to the $\chi$ axis direction, and an arrow in a normal line direction with respect to the arc corresponds to a direction of 2θ/θ. When the X-ray diffraction at about 32° of 2θ/θ is focused, it can be observed that spots of two Reflected X-ray are overlapped on each other. At this time, it is found that the left side inversion is the reflection of the X-ray induced by the (111) orientation of the KNN, and the right side spots show the reflection of the X-ray induced by the (001) orientation of the KNN thin film.

By setting a range of integrated values in a fan-like shape based on such results, each of Reflected X-ray spectra induced by the (001) and (111) orientations can be expressed. In this example, integration is carried out in a range of 17.5° to 72.5° on the $\chi$ axis, and in a range of 31.4° to 32.4° in the 2θ/θ axis direction.

FIG. 6B shows the result. The horizontal axis is the $\chi$ axis, and the vertical axis shows the X-ray diffraction intensity obtained by the aforementioned integration condition. Each of the Reflected X-ray spectra induced by the (001) and (111) orientations can be observed.

Figure 7:
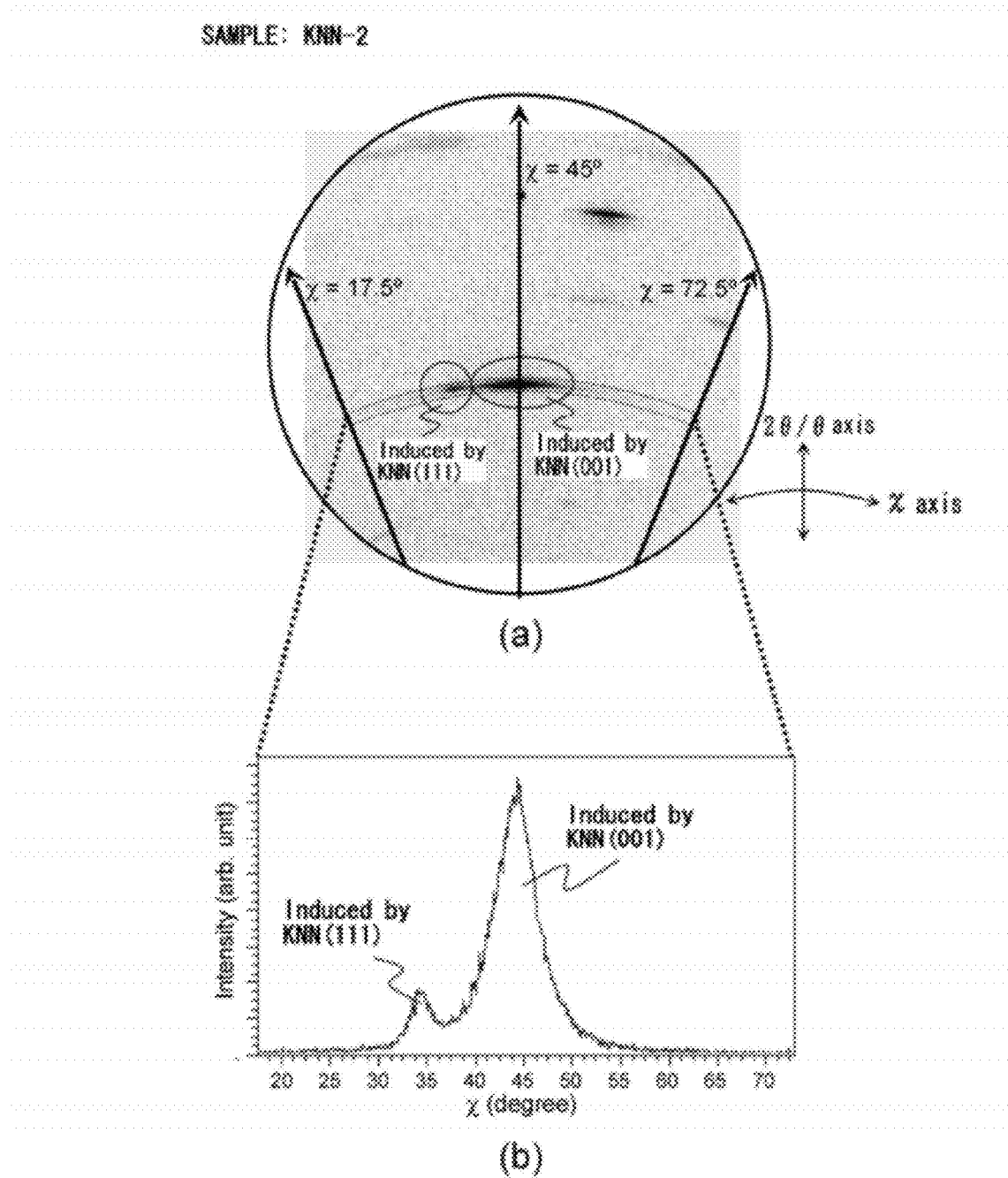

FIG. 7 shows the measurement result of an actual X-ray diffraction of this piezoelectric thin film in the KNN-2 thin film of other sample, according to the example 1. In the same way as FIG. 6, the spectra induced by two orientations can be observed. However, the X-ray intensity induced by the (001) orientation and the X-ray intensity induced by the (111) orientation are different from the result shown in FIG. 6, and clear difference can be observed particularly in an intensity ratio of the intensity induced by the (001) orientation and the intensity induced by the (111) orientation.

In this example, calculation by using a fitting function is performed regarding the profiles of FIG. 6B and FIG. 7B, and the Reflected X-ray intensity and its ratio are quantified.

Figure 8:
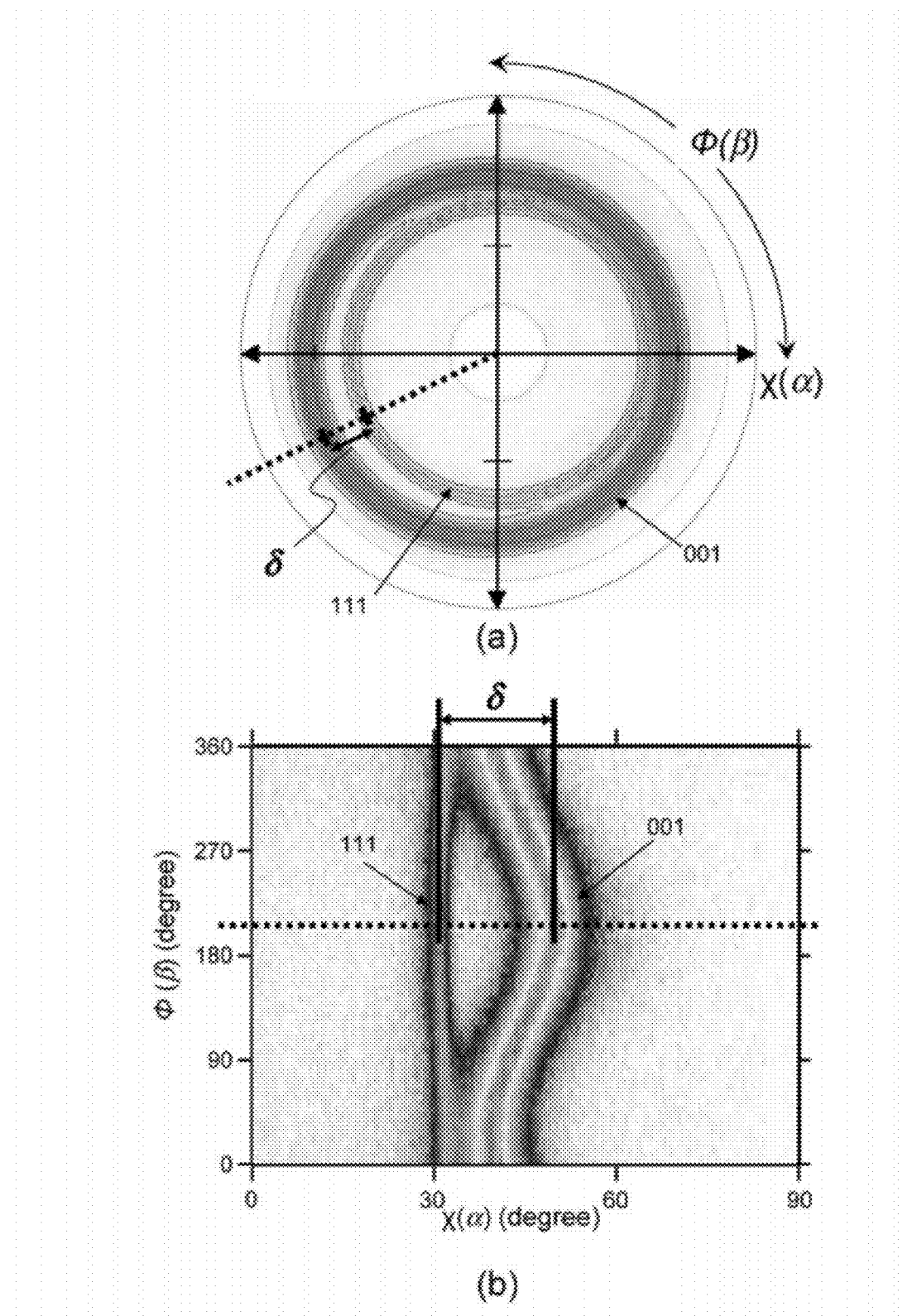

FIG. 8 shows an example of the measurement result of a (110) pole figure of the piezoelectric thin film according to the example 1. Here, as shown in FIG. 8A, a moving radius direction is set on the $\chi(\alpha)$ axis and a circumferential direction is set on the $\Phi(\beta)$ axis. On the $\chi$ axis in the moving radius direction, a Debye ring corresponding to a diffraction surface of (001) is observed in the vicinity of 45° from the center. Meanwhile, the Debye ring corresponding to the diffraction surface of (111) is observed in the vicinity of 35.3°. Particularly, it is found that each Debye ring is shifted from a concentric arrangement, and is slightly shifted from the center. As a result, it is found that reflected X-rays induced by the (001) orientation and induced by the (111) orientation are overlapped on each other in a range of about 0° to 80°, and about 330° to 360°, on the $\Phi$ axis in the circumferential direction. At this time, it is extremely difficult to exactly calculate the intensity of each orientation component.

Accordingly, in order to solve this problem, a measurement position shown in FIG. 4 needs to be taken into consideration. Namely, the position in an in-surface rotating angle (corresponding to the $\Phi$ axis here) of the sample needs to be taken into consideration. Further, in a case that an optimal $\Phi$ axis is unclear, the $\Phi$ axis for clearly separating the reflection spectra induced by the (001) orientation and induced by the (111) orientation needs to be determined, based on the measurement result of the pole figure. Therefore, it is important to exactly grasp an eccentric state of each Debye ring, and obtain the angle of the $\Phi$ axis where δ corresponding to the angle between the (001) orientation direction and the (111) orientation direction is maximum.

In this example, in order to exactly obtain this δ, a graph of a polar coordinate system, with the moving radius direction set as the $\chi(\alpha)$ axis and the circumferential direction set as the $\Phi(\beta)$ axis shown in FIG. 8A, is converted to a graph, with the horizontal axis set as the $\chi$ axis and the vertical axis set as the $\Phi$ axis. FIG. 8B shows the graph of $\chi$-$\Phi$, which is converted to an orthogonal coordinate system. Based on FIG. 8B, an integrated intensity calculation of each orientation component is performed, regarding the X-ray reflection profile at the position of the $\Phi$ axis (dot line in FIG. 8B) where the angle of δ becomes maximum. Note that the integrated intensity here can be obtained by spectrum fitting analysis using Gauss function, Lorentz function, and a convolution function of them such as Pseudo Voight function and Pearson function, and distribution function such as Split Pseudo Voight function.

As described above, according to the example 1, it is found that in order to exactly calculate the intensity of the orientation component, the integrated intensity calculation of each orientation component is performed, regarding the X-ray reflection profile at the position of the $\Phi$ axis where the angle of δ corresponding to the angle between the (001) orientation direction and the (111) orientation direction becomes maximum.

Example 2

Explanation will be given hereinafter by using FIG. 9 to FIG. 10.

Next, a correction value of each X-ray diffraction intensity needs to be examined, to exactly obtain the diffraction intensity ratio of the (001) orientation component and the (111) orientation component. Therefore, the pole figures of the (001) and (111) are examined.

Figure 9:
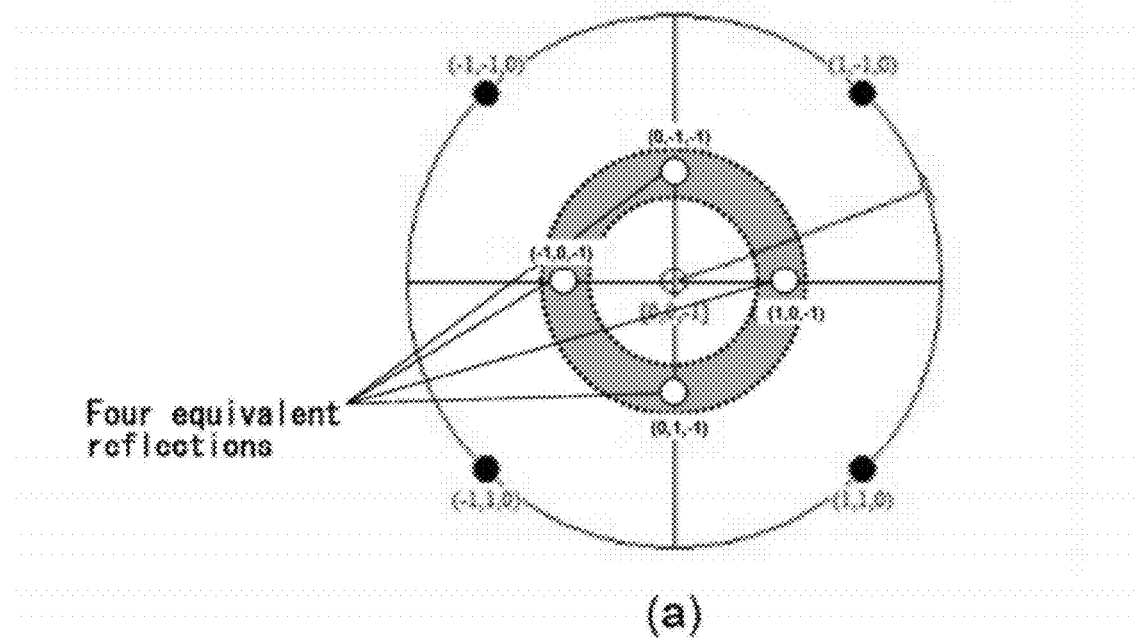
Figure 9:
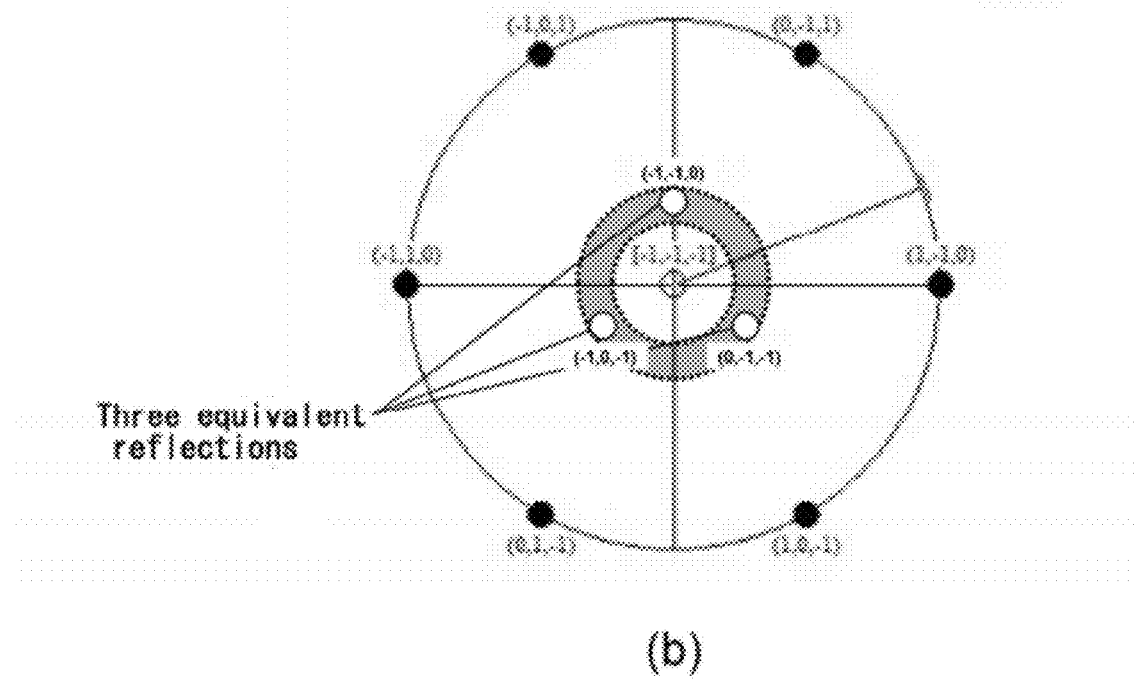
Figure 10:
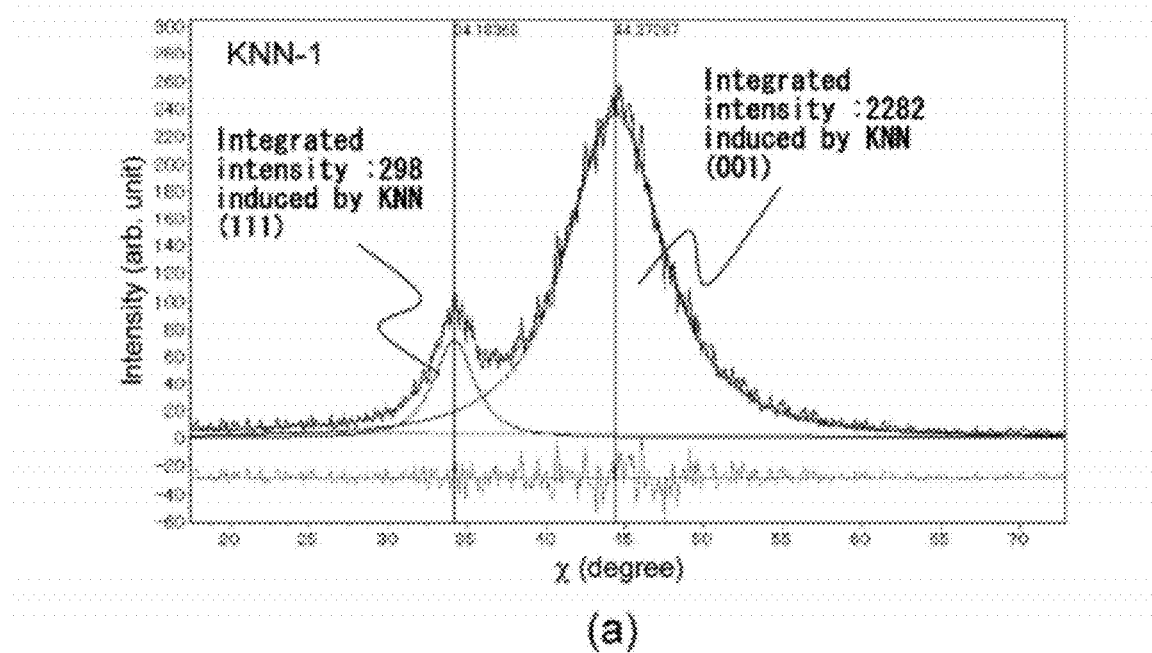
Figure 10:
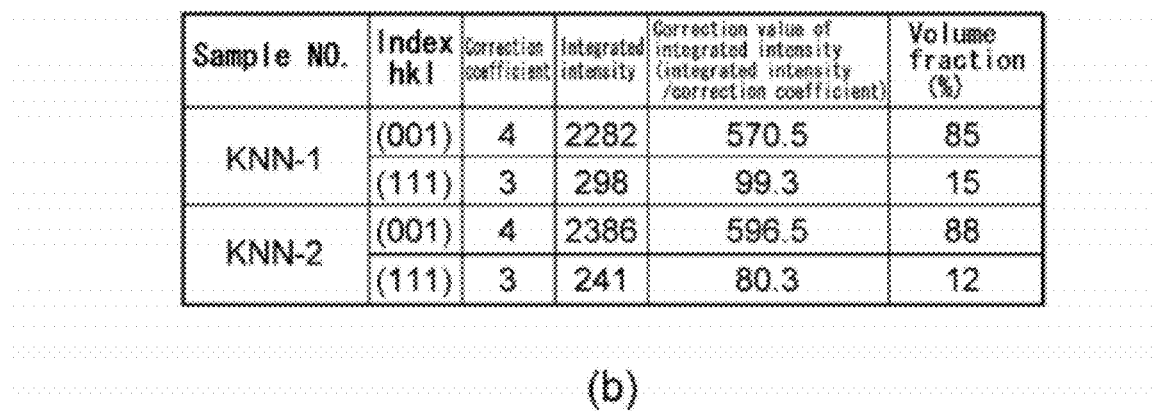

FIG. 9 shows the simulation results of the pole figures. FIG. 9A shows the simulation result of the pole figure, with (001) as the pole. As shown in this figure, it is found that four equivalent diffractions contribute to the (110) diffraction of the KNN having the (001) orientation. A correction coefficient at this time is considered to be 4. Meanwhile, in a case of the (110) diffraction of the KNN having the (111) orientation, it is found that three equivalent diffractions contribute thereto from the result of the simulation of the pole figure, with (111) of FIG. 9B as the pole, and therefore the correction coefficient is considered to be 3. Accordingly, when the volume fraction of the (001) orientation and the (111) orientation is 1:1, which is obtained from the integrated intensity calculation described in the example 1, an actual diffraction intensity ratio is (001):(111)=4:3.

Next, regarding the piezoelectric thin films of the KNN-1 and KNN-2 formed under different fabricating conditions, the result of analyzing the orientation component ratio of the (001) and (111) is shown, by using the measurement results of FIG. 6 and FIG. 7 according to the example 1. In FIG. 10A, the fitting function is applied to the profile of the X-ray diffraction shown in FIG. 6B. A smooth curve shows the Pseudo Voight function used in this example as the fitting function. It is found that the (111) and (001) induced diffraction profiles relatively coincide with each other. At this time, a peak position (the $\chi$ axis in this example), the integrated intensity and a full width at half maximum (FWHM) of each profile are obtained. The calculation of the diffraction intensity ratio is a target here, and therefore the integrated intensity is focused. FIG. 10B shows the summary of the analysis results. Regarding the KNN-1 of the example 1, the integrated intensity regarding the (111) orientation was 298, and the integrated intensity of the (001) orientation was 2282.

Meanwhile, regarding the KNN-2, the former was 241, and the latter was 2386. The exact diffraction intensity of each orientation component can be obtained as the correction value of the integrated intensity shown in FIG. 10B, by dividing the integrated calculation result by the aforementioned correction coefficient. As a result, when analyzing the orientation component ratio of the (001) and (111), with the total of the (001) orientation component and the (111) orientation component set as 100%, the volume fraction of the KNN-1 is (001):(111)=85%:15%, and the KNN-2 is (001):(111)=88%:12%, and it was clarified that the orientation component ratio is different among samples.

Example 3

Figure 11:
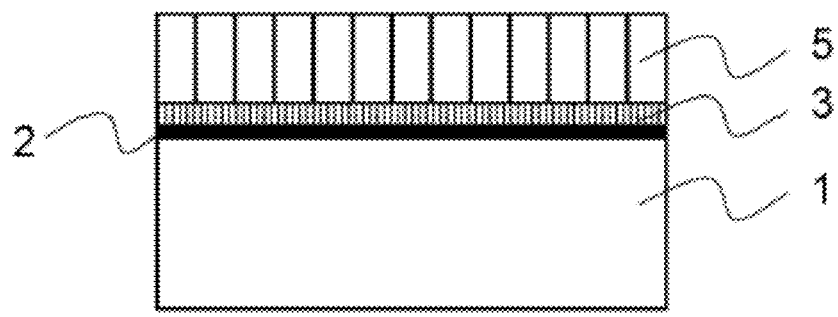
Figure 11:
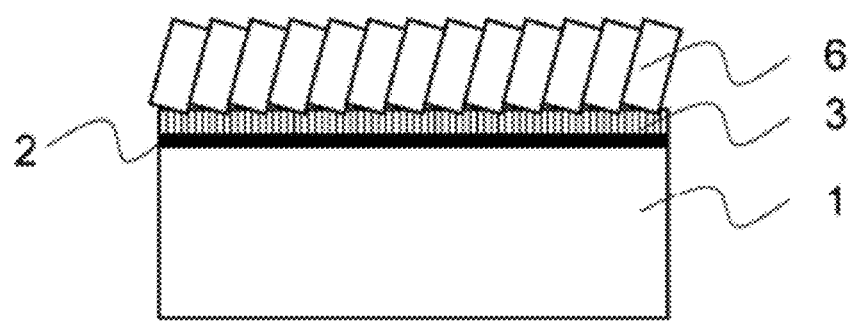

Explanation will be given hereinafter by using FIG. 11 and FIG. 19.

Regarding the example 1, the inventors of the present invention tried to fabricate a preferentially oriented KNN film. Its sectional schematic view is shown in FIG. 11 as example 3. Further, an outline view of an RF sputtering device for fabricating the KNN thin film is shown in FIG. 19. The piezoelectric thin film element is provided, wherein the lower electrode layer 3 and the KNN piezoelectric thin film layer 4 having the perovskite structure are formed on an upper part of the Si substrate 1 having an oxide film on which the adhesive layer 2 is formed. Here, a poly-crystal piezoelectric thin film has a texture in which columnar crystal grains are respectively arranged in approximately a constant direction.

Figure 19:
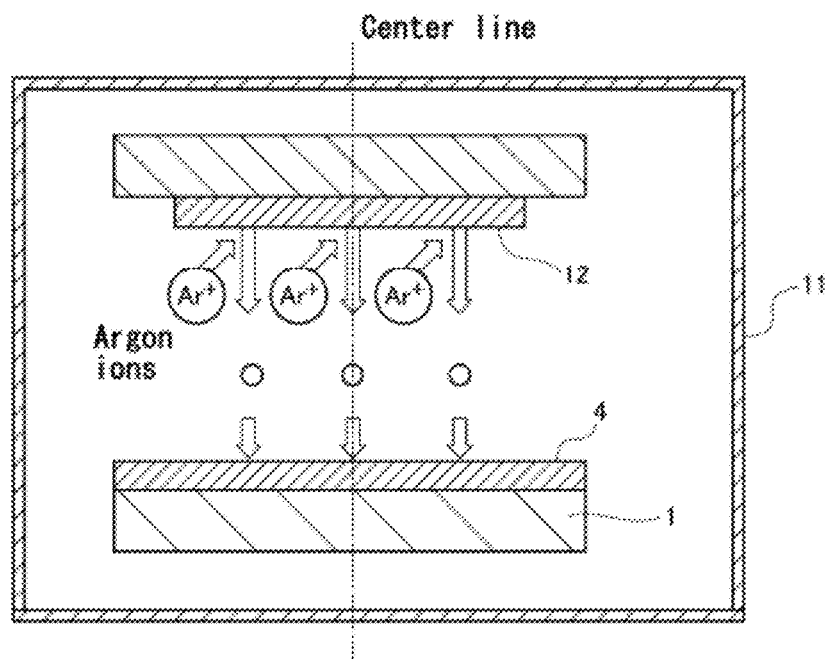
FIG. 19 is a schematic block diagram of an RF sputtering device for fabricating the piezoelectric thin film element using the piezoelectric thin film according to the example 3 of the present invention.

In this example 3, when the KNN piezoelectric thin film 4 is formed, with electric power application set to 100 W, and in such a state that a center of a sputtering target 12 and a center of the substrate 1 are aligned with each other as shown in FIG. 19, the poly-crystal piezoelectric thin film can be prepared in such a manner that the normal line on (001) crystal plane is almost aligned with a direction of the normal line on the substrate surface (001). Here, the columnar crystal grains 5 grow in a vertical direction to the substrate. At this time, in the measurement of the pole figure by a stereographic projection view (FIG. 8A), eccentricity can not be observed in the Debye rings of (001) and (111), and the Debye rings are plotted in such a manner as being arranged concentrically. Further, when the χ axis and the Φ axis of the stereographic projection view are converted to the graph with the x-y axis set as the orthogonal axis (FIG. 8B), a waveform curve can not be observed, and the waveform curve is turned into a straight line.

Next, in this example, when film formation is performed, with electric power application set to 100 W, and the center of the substrate 1 shown in FIG. 19 shifted by about 10 mm from the center of a sputtering target 12, it is confirmed that the normal line direction on the crystal plane of the preferentially oriented crystal grains is slightly shifted and inclined. At this time, columnar crystal grains 6 grow in such a state of being inclined to the normal direction on the substrate surface (FIG. 11B). In addition, shift amount is suitably determined, depending on a used substrate size and a prescribed inclined angle. In this example using the Si substrate of 4 inches, the shift amount is set to 10 mm.

In a stereographic projection of the pole figure of this example, with the shift amount set to 10 mm, in the same way as FIG. 8A, two Debye rings of (001) and (111) are observed, and as shown in FIG. 8B, it is found that each amplitude is different. Namely, this reveals that an off-angle is different, the off-angle being formed by each crystal plane of (001) and (111) with respect to the substrate surface. At this time, an analysis value of the amplitude of (001) was 9.9°. Meanwhile, the analysis value of the amplitude of (111) was 0.52°. As a result, it is found that in the piezoelectric thin film of the present invention, the crystal orientation direction of (001) is inclined at an angle of about 5°, and the crystal orientation direction of (111) is inclined at an angle of about 0.3°, with respect to the normal direction of the substrate surface.

Example 4

Explanation will be given hereinafter by using FIG. 12 to FIG. 15.

As the example 4, the volume fractions of the orientation component of (001) and the orientation component of (111) are intentionally varied and its result is shown.

Figure 12:
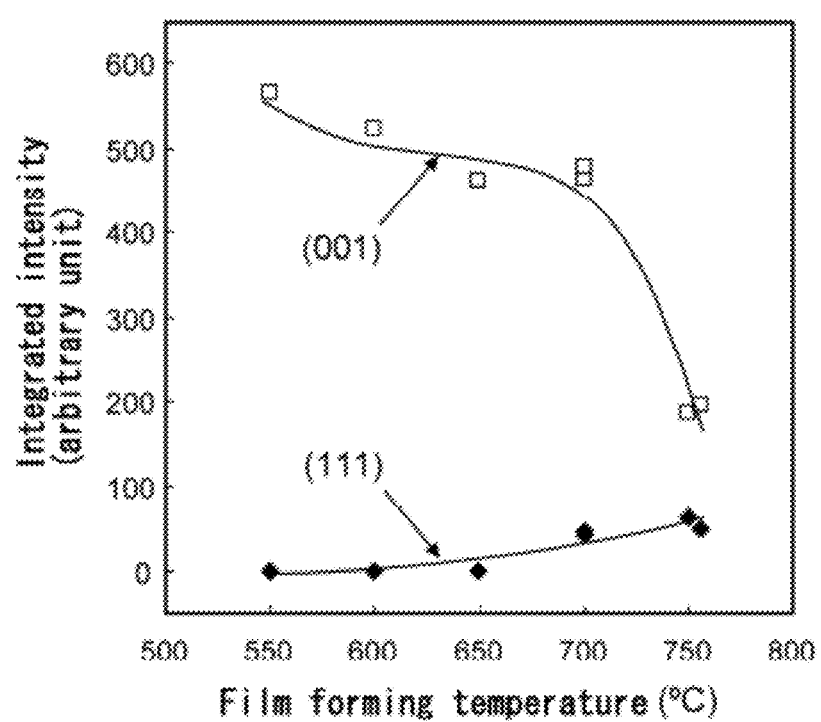
FIG. 12 is a correlation view between a film forming temperature in forming the KNN piezoelectric thin film by sputtering, and an integrated intensity induced by (111) and (001).

FIG. 12 shows a variation of the integrated intensity of the (111) induced and (001) induced diffractions, with respect to a film forming temperature. It is found that the integrated intensity of the (001) induced diffraction is gradually reduced, with an increase of the film forming temperature. Meanwhile, regarding the integrated intensity of the (111) induced diffraction, it is found that the film forming temperature is gradually increased, with the increase of the film forming temperature. Next, by using such results, film forming temperature dependence of the volume fraction is examined in consideration of the correction coefficient shown in the example 2.

FIG. 13 shows the variation of the volume fractions of the (111) and (001) orientation components, with respect to the film forming temperature of the KNN piezoelectric thin film, in the film formation by sputtering. As shown in this figure, the volume fraction of the (111) orientation component is almost 0 in a range of the film forming temperature from 550° C. to 650° C. However, when the film forming temperature exceeds 650° C., it is found that the volume fraction of the (111) orientation component is increased, with the increase of the film forming temperature.

Meanwhile, the variation of the volume fraction of the (001) orientation component with respect to the film forming temperature stays almost at 100%, and it is found that only (001) plane is in substantially a single orientation state. Further, when the film forming temperature exceeds 650° C., it is found that the volume fraction of the (001) orientation component is gradually reduced, with the increase of the film forming temperature. This examples shows that when the film forming temperature exceeds 650° C., the ratio of the (111) orientation component and the (001) orientation component can be controlled by changing the film forming temperature.

Further, FIG. 14 shows the variation of an internal stress (distortion) caused by the film forming temperature of the KNN piezoelectric thin film, which is caused during film formation by sputtering. It is found that a compressive stress is lessened, with the increase of the film forming temperature, and a condition is changed to a distortion free condition without stress. When the film forming temperature is increased from 700° C. to 750° C., it is found that the condition is changed to a state of a slightly tensile stress from the substantially distortion free condition. Further, Pa can be given as an example of a unit of the internal stress in this example.

As is clarified if compared with FIG. 13, FIG. 14 shows that the compressive stress is reduced, with the increase of the volume fraction of (111). Namely, it shows that alleviation of the internal stress of this piezoelectric thin film can be realized, with the increase of the (111) orientation component ratio of the KNN piezoelectric thin film. As a result, by precisely controlling the component ratio (volume fraction) of the crystal orientation, the internal stress of the piezoelectric thin film can be controlled. Further, it is also possible to obtain the piezoelectric thin film having a desired internal stress under control of the crystal orientation, by changing factors other than the film forming temperature, such as sputtering target composition, electric power application during the film formation, the kind of gases, flow rate and pressure of this gas, or the kind and structure of a base.

Further, since the piezoelectric thin film has a volume fraction of component (111), and therefore stress of the piezoelectric thin film can be relaxed, and film peel-off can be inhibited. Thus, the mechanical strength of the piezoelectric thin film is improved, and the piezoelectric thin film excellent in easiness of processing can be provided.

Figure 15:
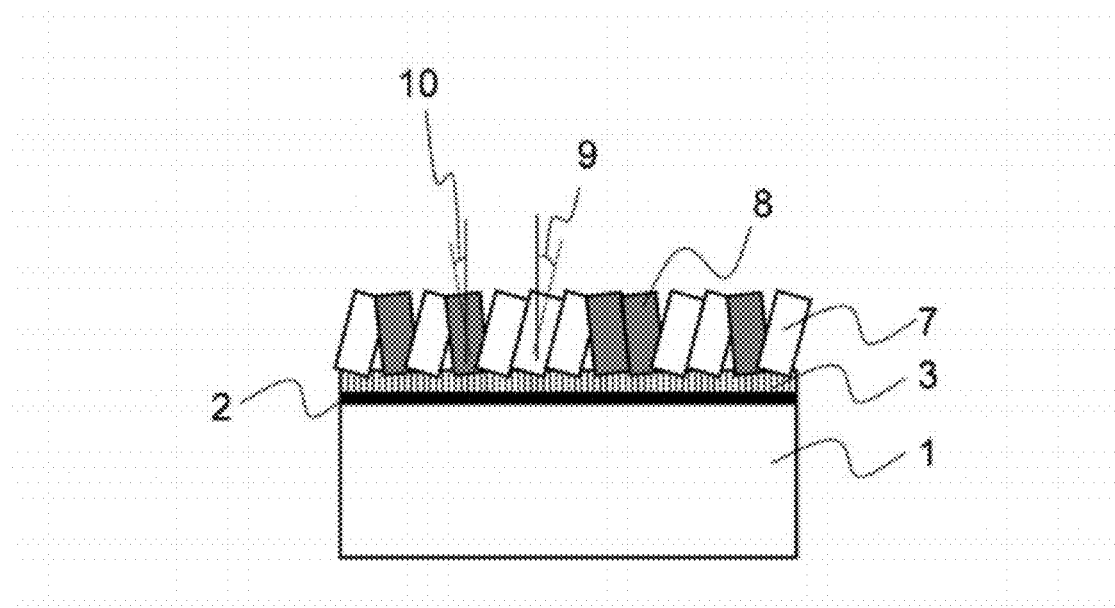
FIG. 15 is a sectional view showing a state that each preferentially oriented crystal grain has a constant inclination angle, with respect to a substrate surface of a piezoelectric thin film in which preferential orientations (001) and (111) coexist.

FIG. 15 shows a sectional schematic view, as an embodiment of the present invention, wherein (001) preferentially oriented crystal grains ([001] axis orientation) 9, and (111) preferentially oriented crystal grains ([111] axis orientation) 10 are in a coexistence state. By realizing a state of the crystal orientation shown in FIG. 15, the piezoelectric characteristics can be improved by controlling the internal stress. Further, film peel-off can be suppressed by alleviating the stress. Therefore, a mechanical strength of the piezoelectric thin film can be improved, and the piezoelectric thin film easy to be processed can be provided.

In a case of confirming the yield of the element that can be acquired from a plurality of substrates of 4 inches, the result shows that the yield does not satisfy 70% in the element acquired from the substrate with piezoelectric thin film wherein the component (111) is under 1%. Meanwhile, the yield exceeds 90% in the element acquired from the substrate with piezoelectric thin film wherein component (111) exceeds 1%.

As a result of the examination by the inventors of the present invention, the aforementioned result is considered to be caused by the magnitude of the variation of the piezoelectric constant in the wafer surface. Results of confirming the relation between the volume fraction of the (111) oriented component and the piezoelectric constant in the wafer surface are shown in table 1 and FIG. 20.

TABLE 1

| Sample | (111) volume fraction (%) | variation of piezoelectric constant (%) |
|---|---|---|
| Sample 1 | 3.6 | 21.4 |
| Sample 2 | 3.3 | 24.5 |
| Sample 3 | 9.9 | 9.3 |
| Sample 4 | 12.6 | 9.4 |
| Sample 5 | 0.1 | 27.1 |
| Sample 6 | 0.1 | 25.6 |
| Sample 7 | 0.1 | 23.9 |
| Sample 8 | 0.2 | 15.3 |
| Sample 9 | 0.2 | 22.7 |
| Sample 10 | 9.8 | 16.3 |

Figure 20:
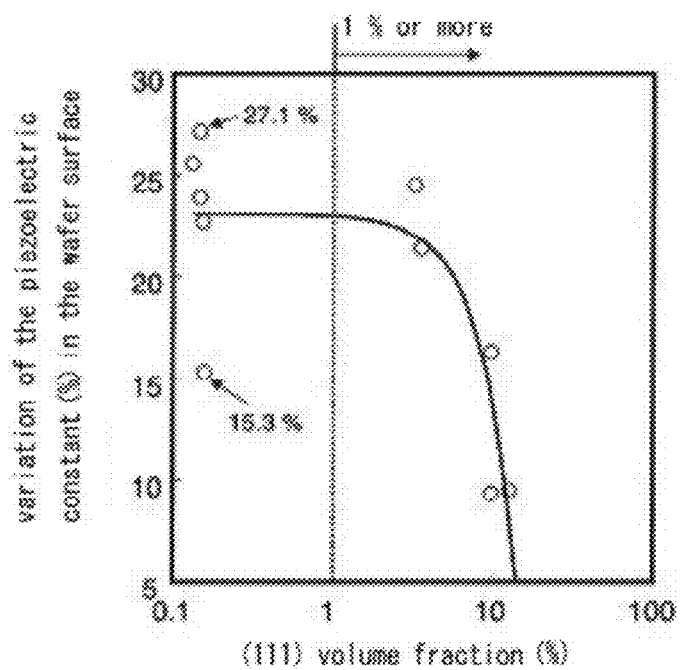
FIG. 20 is a view showing a result of confirming a relation between the volume fraction and variation of the piezoelectric constant (%) in the wafer surface of the piezoelectric thin film, in the piezoelectric thin film element using the piezoelectric thin film according to the example 4 of the present invention.
Figure 21:
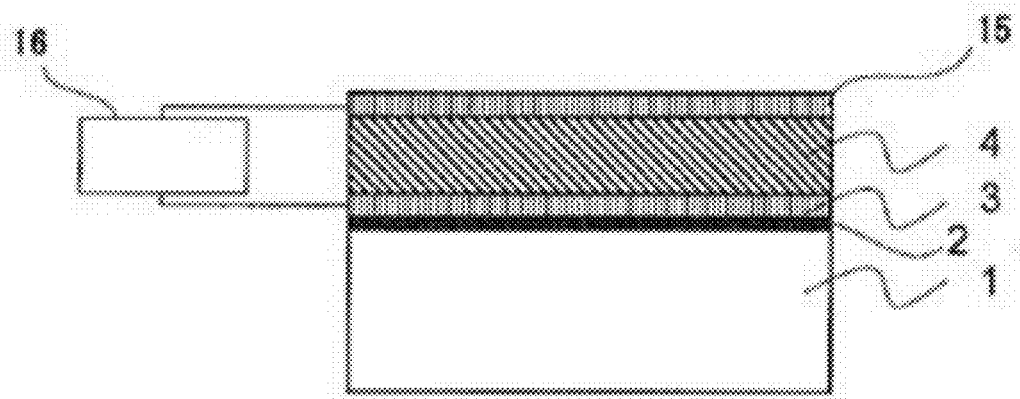
FIG. 21 is a sectional view of the piezoelectric thin film device using the piezoelectric thin film of the first embodiment of the present invention.

As shown in FIG. 20, regarding the variation of the piezoelectric constant in the wafer surface, it is found that there is no increase in the variation and the piezoelectric constant stays constant, at a point where the volume fraction of the (111) oriented component reaches approximately 1%. The variation of the piezoelectric constant shown here, is a relative standard deviation obtained by dividing a standard deviation of the piezoelectric constant measured in the wafer surface of 4 inches, by its mean value. The value at this time was about 23%. However, when (111) volume fraction is about 0.2%, variation range is 15.3% to 27.1%, thus enlarging the difference of the variation for every wafer even in a case of the same (111) volume fraction, and this is a factor of reducing the yield.

Example 5

Explanation will be given hereinafter by using FIG. 16 to FIG. 18.

As example 5, FIG. 16 shows the variation of the piezoelectric characteristics, with respect to the (111) integrated intensity of the KNN piezoelectric thin film. The (111) integrated intensity is taken on the horizontal axis, and the piezoelectric constant is taken on the vertical axis. Here, as an example, the piezoelectric constant is shown, in a case of applying an electric field at 6.7 MV/m or 0.67 MV/m. Note that an arbitrary unit can be set as the unit of the piezoelectric constant. However, as a specific example of an actual piezoelectric constant, $d_{33}$ being a variation amount of the extension/contraction in a vertical (thickness) direction to an electrode surface, or $d_{31}$ being a variation amount of the extension/contraction in a direction along the electrode surface, can be given.

An arbitrary unit is set as the unit of the piezoelectric constant, and this is because it is not easy to obtain the values of the Young's modulus and the Poisson's ratio of a piezoelectric layer (piezoelectric thin film), although the values of the Young's modulus and the Poisson's ratio of the piezoelectric layer are required for obtaining the piezoelectric constant. Particularly, a thin film is affected by (or condistortioned) by a used substrate during film formation, and therefore it is not principally easy to obtain an absolute value (true value) of the Young's modulus and the Poisson's ratio (constant) of the thin film itself. Therefore, the piezoelectric constant is calculated by using estimated values of the Young's modulus and the Poisson's ratio of the KNN film that has been known heretofore. Accordingly, the obtained piezoelectric constant is an estimated value, and therefore the piezoelectric constant is set to an arbitrary unit relatively and objectively. However, although the Young's modulus and the Poisson's ratio of the KNN film used in the calculation of the piezoelectric constant are the estimated values, it can be said that these values are somewhat reliable values, and about 80 [arbitrary unit] of the piezoelectric constant shows that the piezoelectric constant $d_{31}$ is approximately 80[-pm/V]. This can also be said for the case of FIG. 17 and FIG. 18.

As shown in FIG. 16, it is possible to observe a tendency that when the (111) orientation-induced X-ray intensity is slightly increased, the piezoelectric constant is increased accordingly. However, when the (111) induced integrated intensity analyzed in this example exceeds 100, it is found that the piezoelectric constant is flatly reduced, with the increase of the integrated intensity.

Table 2 and FIG. 17 show the result of confirming a dependence of the piezoelectric characteristics of the KNN piezoelectric thin film, on the (111) orientation component ratio, for comparison with the (001) orientation component. In FIG. 17, the volume fraction of the (111) orientation component is taken on the horizontal axis, and the piezoelectric constant is taken on the vertical axis. In this example, it is found that the piezoelectric constant is increased, with the increase of the (111) volume fraction, in a range from 0 to 20% of the (111) oriented component, irrespective of a magnitude of an applied electric field.

TABLE 2

| Sample | (111) volume fraction (%) | Piezoelectric constant @6.7 MV/m | Piezoelectric constant @0.67 MV/m |
|---|---|---|---|
| Sample 1 | 79 | 25.1 | 12.0 |
| Sample 2 | 53 | 33.5 | 26.9 |
| Sample 3 | 78 | 20.9 | 12.4 |
| Sample 4 | 9 | 64.5 | 62.8 |
| Sample 5 | 0 | 66.1 | 62.9 |
| Sample 6 | 12 | 57.2 | 56.6 |
| Sample 7 | 25 | 86.8 | 67.5 |
| Sample 8 | 20 | 88.3 | 73.3 |
| Sample 9 | 28 | 65.0 | 59.0 |
| Sample 10 | 34 | 60.4 | 54.0 |
| Sample 11 | 0 | 64.6 | 63.4 |
| Sample 12 | 5 | 79.0 | 66.4 |
| Sample 13 | 4 | 82.7 | 74.1 |

However, when the (111) volume fraction exceeds 20%, it is found that the piezoelectric constant is reduced, with the increase of such a volume fraction. Particularly, when the (111) volume fraction exceeds 40%, it is found that the piezoelectric constant becomes a value of about half of a maximum value obtained by this example. In other words, in the piezoelectric thin film in this example, it is desirable to set the volume fraction of (111) to 40% or less, for securing 50% or more of the maximum piezoelectric constant. Further, generally in order to improve the piezoelectric characteristics of a piezoelectric material, it is also important to improve a degree of crystallinity, and the improvement of the piezoelectric characteristics can be confirmed by a high integrated intensity of the X-ray diffraction. In this example, the degree of crystallinity becomes high when the volume fraction of (111) is 30% or less. Therefore, the piezoelectric thin film having further higher performance can be realized, provided that higher degree of crystallinity is realized and thereafter an optimal volume fraction is defined.

Next, table 3 and FIG. 18 shows the result of confirming the dependence of the piezoelectric characteristics of the KNN piezoelectric thin film, on the (001) orientation component ratio.

TABLE 3

| Sample | (001) volume fraction (%) | Piezoelectric constant @6.7 MV/m | Piezoelectric constant @0.67 MV/m |
|---|---|---|---|
| Sample 1 | 21 | 25.1 | 12.0 |
| Sample 2 | 47 | 33.5 | 26.9 |
| Sample 3 | 22 | 20.9 | 12.4 |
| Sample 4 | 91 | 64.5 | 62.8 |
| Sample 5 | 100 | 66.1 | 62.9 |
| Sample 6 | 88 | 57.2 | 56.6 |
| Sample 7 | 75 | 86.8 | 67.5 |
| Sample 8 | 80 | 88.3 | 73.3 |
| Sample 9 | 72 | 65.0 | 59.0 |
| Sample 10 | 66 | 60.4 | 54.0 |
| Sample 11 | 100 | 64.6 | 63.4 |
| Sample 12 | 95 | 79.0 | 66.4 |
| Sample 13 | 96 | 82.7 | 74.1 |

It is found that the dependence of the (001) volume fraction of the piezoelectric constant is set in a reverse relation with that of (111). Namely, it is found that the piezoelectric constant is increased, with the increase of the (001) orientation component. However, when the (001) volume fraction is 80% or more, it is found that there is a tendency that the piezoelectric constant is reduced. Further, in the piezoelectric thin film of this example, it is desirable to set the volume fraction to 60% or more, for realizing the value so that the maximum piezoelectric constant is 50% or more. Note that in this example, the total of the (001) and (111) volume fractions is assumed to be 100%.

As shown in FIG. 17 and FIG. 18, specifically in the piezoelectric thin film, with (111) volume fraction set to 21% and (001) volume fraction set to 79%, piezoelectric constant 87 was obtained when 6.7 MV/m was applied. Manufacturing conditions samples FIG. 17 and FIG. 18 are as follows.

Si substrate having a thickness of 0.525 mm was used as a substrate. A thermal oxide film of 200 nm is formed on the surface of the Si substrate.

First, a Ti adhesive layer having film thickness of 2 nm was formed on this substrate and a Pt lower electrode having film thickness of 100 nm was formed on this Ti adhesive layer. Both of the Ti adhesive layer and the Pt lower electrode were formed at substrate temperature of 350° C., with power application of 100 W, under 100% Ar gas atmosphere, and under pressure of 2.5 Pa, by using an RF magnetron sputtering method.

Next, the KNN film having thickness of 3 μm was formed on the Pt lower electrode. In this KNN film, an inclination angle in the crystal orientation direction of (001) was 3.0°, and an inclination angle in the crystal orientation direction of (111) was 0.5°. The KNN film was formed in a self-revolving furnace by using the RF magnetron sputtering method. The film forming conditions were as follows.

A sintered compact of $(Na_xK_yLi_z)NbO_3$ (x=0.5, y=0.5, z=0) was used in the KNN film. A shift amount between the center of this target and the center of the substrate was set to 10 mm, and density of a sputtering target material was set to 4.6 g/cm$^3$. Then, the substrate temperature was set to 700° C., and the power application was set to 100 W. Further, the pressure in the chamber was set to 1.3 Pa, and the gas mixing ratio of Ar and $O_2$ was set to 5:5. Then, annealing was performed after film formation. An annealing temperature was set to 700° C. and annealing time was set to 2.0 hr in the atmosphere.

As described above, the present invention has been described based on limited numbers of examples. However, the scope of the present invention is not limited to these examples. The scope of the present invention should be limited by claims, and various modifications within the scope of the claims and within the scope equivalent thereto are included.

Preferred aspects of the present invention will be additionally described hereinafter.

According to an aspect of the present invention, a piezoelectric thin film element is provided, comprising: at least a lower electrode, a piezoelectric thin film represented by a general formula $(Na_xK_yLi_z)NbO_3 (0 \leq x \leq 1, 0 \leq y \leq 1, 0 \leq z \leq 0.2, x+y+z=1)$, and an upper electrode disposed on a substrate, wherein the piezoelectric thin film has a crystal structure of a pseudo-cubic crystal or a tetragonal crystal or an orthorhombic crystal, or has a composition in which one of these crystals exists or at least two more of them coexist, and is preferentially oriented to a specific axis smaller than or equal to two axes of these crystals, and in the ratio of component (001) to component (111), volume fraction of the component (001) falls within a range of 60%-100%, and the volume fraction of the component (111) falls within a range of 0%-40%, in a case that the total of the component (001) and the component (111) is set to be 100%.

In this case, particularly, the volume fraction of the component (001) is preferably set within a range of 70% or more and 100% or less, and the volume fraction of the component (111) is preferably set within a range of 0% or more and 30% or less.

In this case, preferably a co-existence structure of the component (001) and the component (111) is obtained.

Further, preferably the volume fraction of the component (111) falls within a range greater than 1%.

Further, according to other aspect of the present invention, a piezoelectric thin film element is provided, comprising a piezoelectric thin film lamination with a piezoelectric thin film represented by a general formula $(Na_xK_yLi_z)NbO_3 (0 \leq x \leq 1, 0 \leq y \leq 1, 0 \leq z \leq 0.2, x+y+z=1)$ disposed on a substrate, wherein the piezoelectric thin film has a crystal structure of a pseudo-cubic crystal or a tetragonal crystal or an orthorhombic crystal, or has a composition in which one of these crystals exists or at least two or more of them coexist, and is preferentially oriented to a specific axis smaller than or equal to two axes of these crystals, and in the ratio of component (001) to component (111), volume fraction of the component (001) falls within a range of 60% or more and 100% or less, and the volume fraction of the component (111) falls within a range of 0% or more and 40% or less, in a case that the total of the component (001) and the component (111) is set to be 100%.

In this case, preferably the volume fraction of the component (111) is within a range greater than 1%.

Further, preferably a base layer is provided between the substrate and the piezoelectric thin film.

Further, preferably the base layer is an electrode layer of Pt or an alloy mainly composed of Pt, or has a lamination structure including these electrode layers mainly composed of Pt.

Further, preferably the base layer is preferentially oriented in (111) direction.

Further, preferably the piezoelectric thin film has a textile constituted of particles of columnar structure.

Further, preferably the piezoelectric thin film has a distortion in a parallel direction to a substrate surface.

Further, preferably the distortion has a distortion in a tensile force state or a distortion in a compressive stress state.

Further, preferably the substrate is a Si substrate.

Further, according to another aspect of the present invention, a piezoelectric thin film device including any one of the aforementioned piezoelectric thin film element, and a voltage application part or a voltage detection part.

What is claimed is:

1. A piezoelectric thin film element, comprising:
a piezoelectric thin film lamination with at least a lower electrode, a piezoelectric thin film represented by a general formula $(Na_xK_yLi_z)NbO_3$ wherein $0 \leq x \leq 1$, $0 \leq y \leq 1$, $0 \leq z \leq 0.2$, and wherein x+y+z=1, and an upper electrode, disposed on a substrate,
wherein the piezoelectric thin film has a crystal structure of a pseudo-cubic crystal or a tetragonal crystal or an orthorhombic crystal, or has a composition in which one of these crystals exist or at least two or more of them coexist, and is preferentially oriented to a specific axis smaller than or equal to two axes of these crystals, and in the ratio of component (001) to component (111), volume fraction of the component (001) falls within a range of 60% or more and 100% or less, and the volume fraction of the component (111) falls within a range of 0% or more and 40% or less, in a case that the total of the component (001) and the component (111) is set to be 100%.

2. The piezoelectric thin film element according to claim 1, having a coexistence structure of the component (001) and the component (111), in the piezoelectric thin film element according to claim 1.

3. The piezoelectric thin film element according to claim 2, wherein volume fraction of the component (111) falls within a range greater than 1%.

4. The piezoelectric thin film element according to claim 1, wherein the lower electrode layer is an electrode layer of Pt or an alloy mainly composed of Pt, or has a lamination structure including these electrode layers mainly composed of Pt.

5. The piezoelectric thin film element according to claim 1, wherein the piezoelectric thin film has a texture constituted of particles of a columnar structure.

6. The piezoelectric thin film element according to claim 1, wherein the piezoelectric thin film has a distortion in parallel to a substrate surface.

7. The piezoelectric thin film element according to claim 6, wherein the distortion has a distortion in a tensile stress state, or a distortion in a compressive stress state.

8. A piezoelectric thin film device, including the piezoelectric thin film element according to claim 1, a voltage application part or a voltage detection part.

9. A piezoelectric thin film device, including the piezoelectric thin film element according to claim 8, a voltage application part or a voltage detection part.

10. A piezoelectric thin film element, comprising a piezoelectric thin film lamination with a piezoelectric thin film represented by a general formula $(Na_xK_yLi_z)NbO_3$ wherein $0 \leq x \leq 1$, $0 \leq y \leq 1$, $0 \leq z \leq 0.2$, and wherein x+y+z=1, disposed on a substrate,
wherein the piezoelectric thin film has a crystal structure of a pseudo-cubic crystal or a tetragonal crystal or an orthorhombic crystal, or has a composition in which one of these crystals exists or at least two of them coexist, and is preferentially oriented to a specific axis smaller than or equal to two axes of these crystals, with the component (001) and the component (111), being components of the preferentially oriented crystal axes in a coexistence state, and in the ratio of component (001) to component (111), volume fraction of the component (001) falls within a range of 60% or more and 100% or less, and the volume fraction of the component (111) falls within a range of 0% or more and 40% or less, in a case that the total of the component (001) and the component (111) is set to be 100%.

11. The piezoelectric thin film element according to claim 10, wherein a base layer is provided between the substrate and the piezoelectric thin film.

12. The piezoelectric thin film element according to claim 10, wherein the piezoelectric thin film has a texture constituted of particles of a columnar structure.

13. The piezoelectric thin film element according to claim 10, wherein the piezoelectric thin film has a distortion in parallel to a substrate surface.

14. The piezoelectric thin film element according to claim 13, wherein the distortion has a distortion in a tensile stress state, or a distortion in a compressive stress state.

15. A piezoelectric thin film device, including the piezoelectric thin film element according to claim 10, a voltage application part or a voltage detection part.

16. A piezoelectric thin film device, including the piezoelectric thin film element according to claim 15, a voltage application part or a voltage detection part.

* * * * *